(12) United States Patent
Lien et al.

(10) Patent No.: US 11,587,619 B2
(45) Date of Patent: Feb. 21, 2023

(54) BLOCK CONFIGURATION FOR MEMORY DEVICE WITH SEPARATE SUB-BLOCKS

(71) Applicant: SanDisk Technologies LLC, Addison, TX (US)

(72) Inventors: Yu-Chung Lien, San Jose, CA (US); Jiahui Yuan, Fremont, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 131 days.

(21) Appl. No.: 17/360,677

(22) Filed: Jun. 28, 2021

(65) Prior Publication Data
US 2022/0415398 A1    Dec. 29, 2022

(51) Int. Cl.
*G11C 11/00* (2006.01)
*G11C 16/08* (2006.01)
*G11C 16/04* (2006.01)

(52) U.S. Cl.
CPC .......... *G11C 16/08* (2013.01); *G11C 16/0483* (2013.01)

(58) Field of Classification Search
CPC ..... G11C 16/16; G11C 16/3445; G11C 16/10; G11C 16/32; G11C 16/26; G11C 16/14; G11C 7/04; G11C 2029/0411; G11C 16/3459; G11C 11/5628; G11C 7/14; G11C 5/146; G11C 16/08; G11C 16/0483
See application file for complete search history.

(56) References Cited

U.S. PATENT DOCUMENTS

| | | | |
|---|---|---|---|
| 10,157,680 B2 | 12/2018 | Yang et al. | |
| 10,726,920 B2 | 7/2020 | Yang | |
| 10,839,922 B2 | 11/2020 | Yang et al. | |
| 2008/0091871 A1* | 4/2008 | Bennett | G06F 12/0246 711/E12.008 |
| 2011/0093680 A1* | 4/2011 | Lordello | G06F 12/0292 711/E12.001 |
| 2017/0139839 A1* | 5/2017 | Ke | G06F 3/0679 |
| 2019/0348129 A1* | 11/2019 | Chin | G11C 16/0483 |

OTHER PUBLICATIONS

U.S. Appl. No. 16/870,930, filed May 9, 2020.

* cited by examiner

*Primary Examiner* — Hien N Nguyen
(74) *Attorney, Agent, or Firm* — Vierra Magen Marcus LLP

(57) ABSTRACT

A memory device is provided in which blocks of memory cells are divided into separate portions or sub-blocks with respective sets of word line switching transistors. The sub-blocks can be arranged on a substrate on opposite sides of a dividing line, where a separate set of bit lines is provided on each side of the dividing line. Each block has a row decoder which provides a common word line voltage signal to each sub-block of the block. However, each sub-block can have an independent set of word line switching transistors so that the common word line voltage signal can be passed or blocked independently for each sub-block. The blocks of memory cells can be provided on a first die which is inverted and bonded to a second die which includes the sets of word line switching transistors.

20 Claims, 23 Drawing Sheets

Fig. 1A
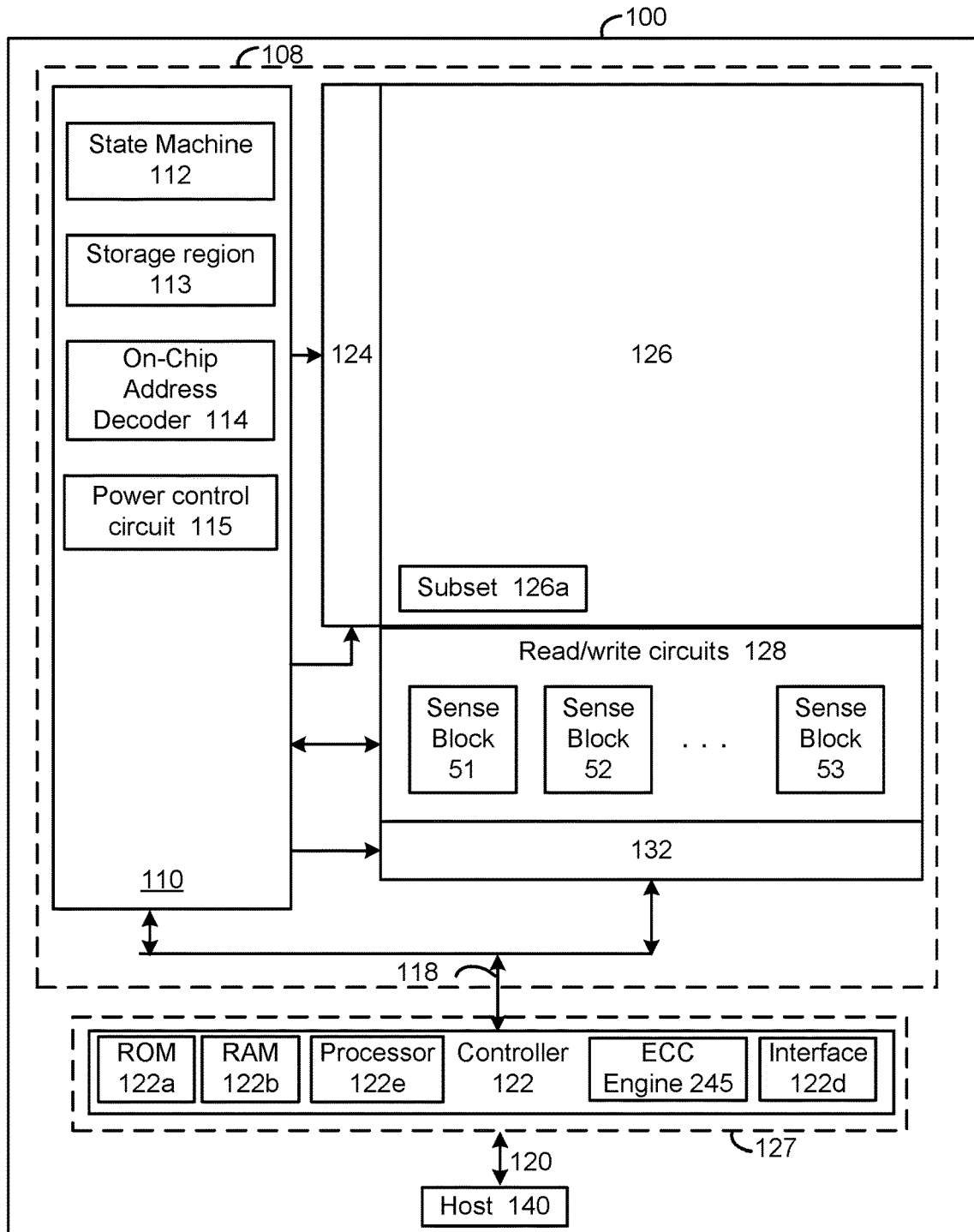
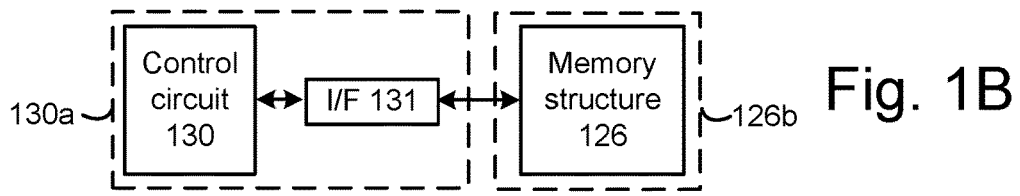
Fig. 1B

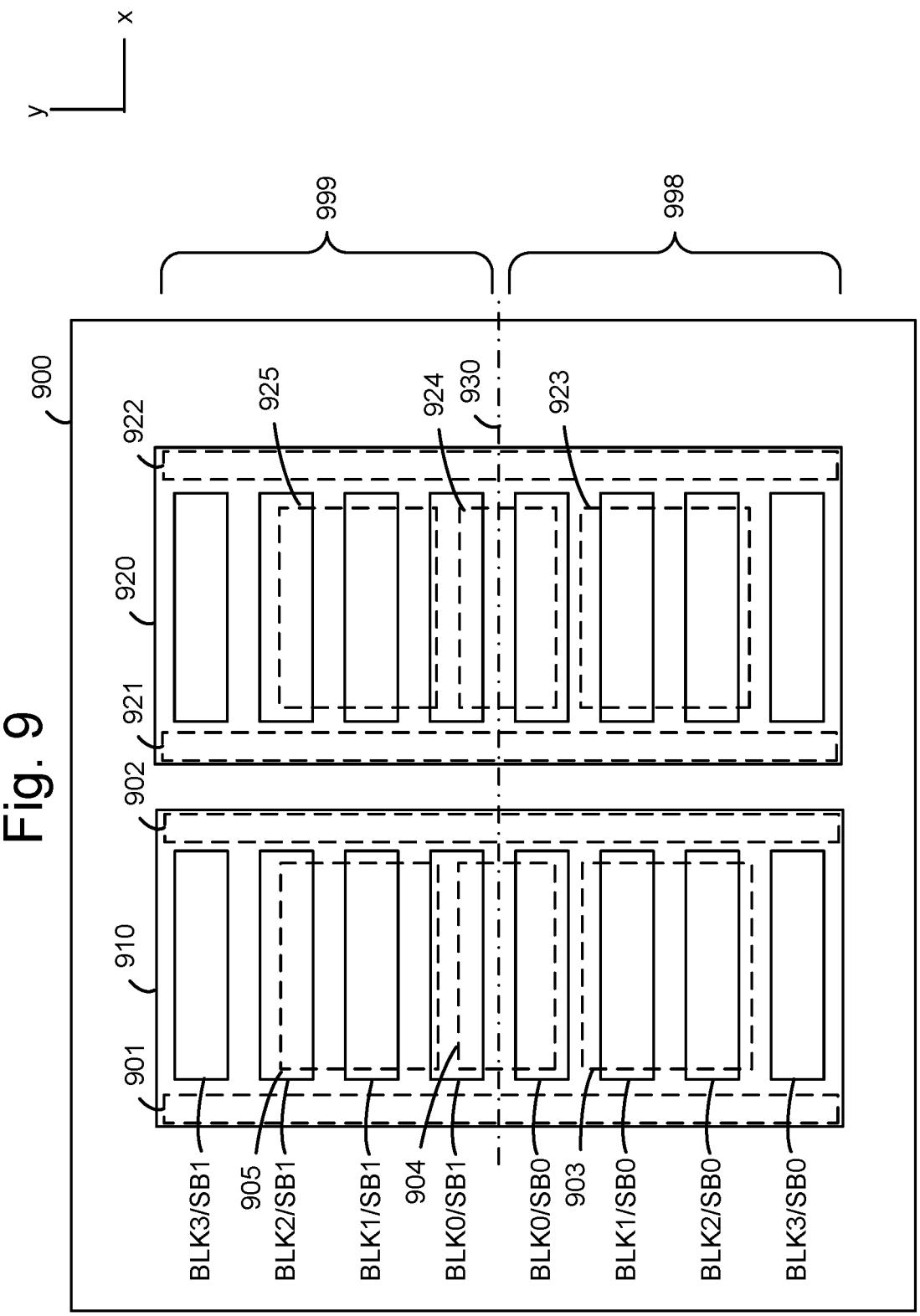

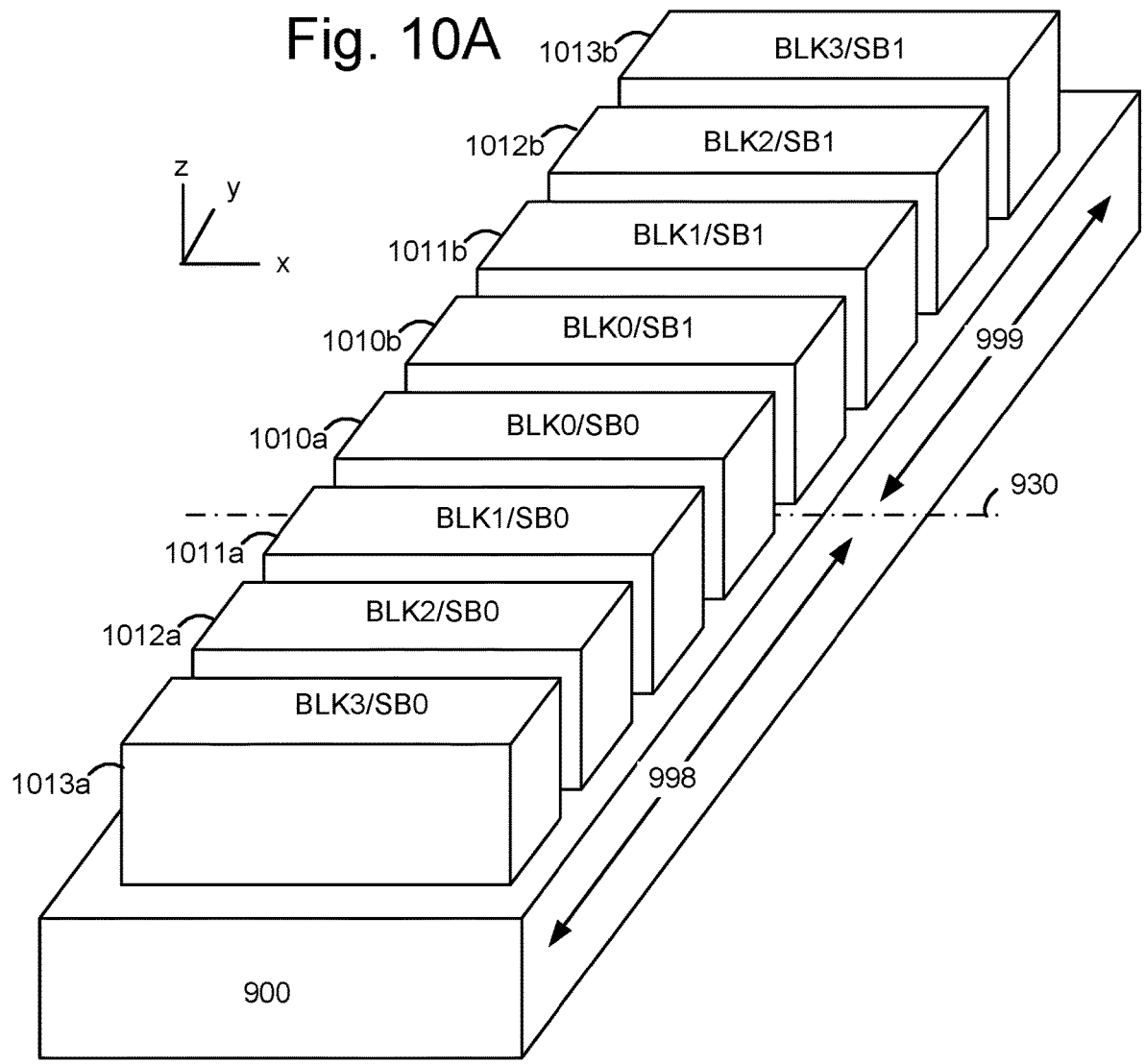

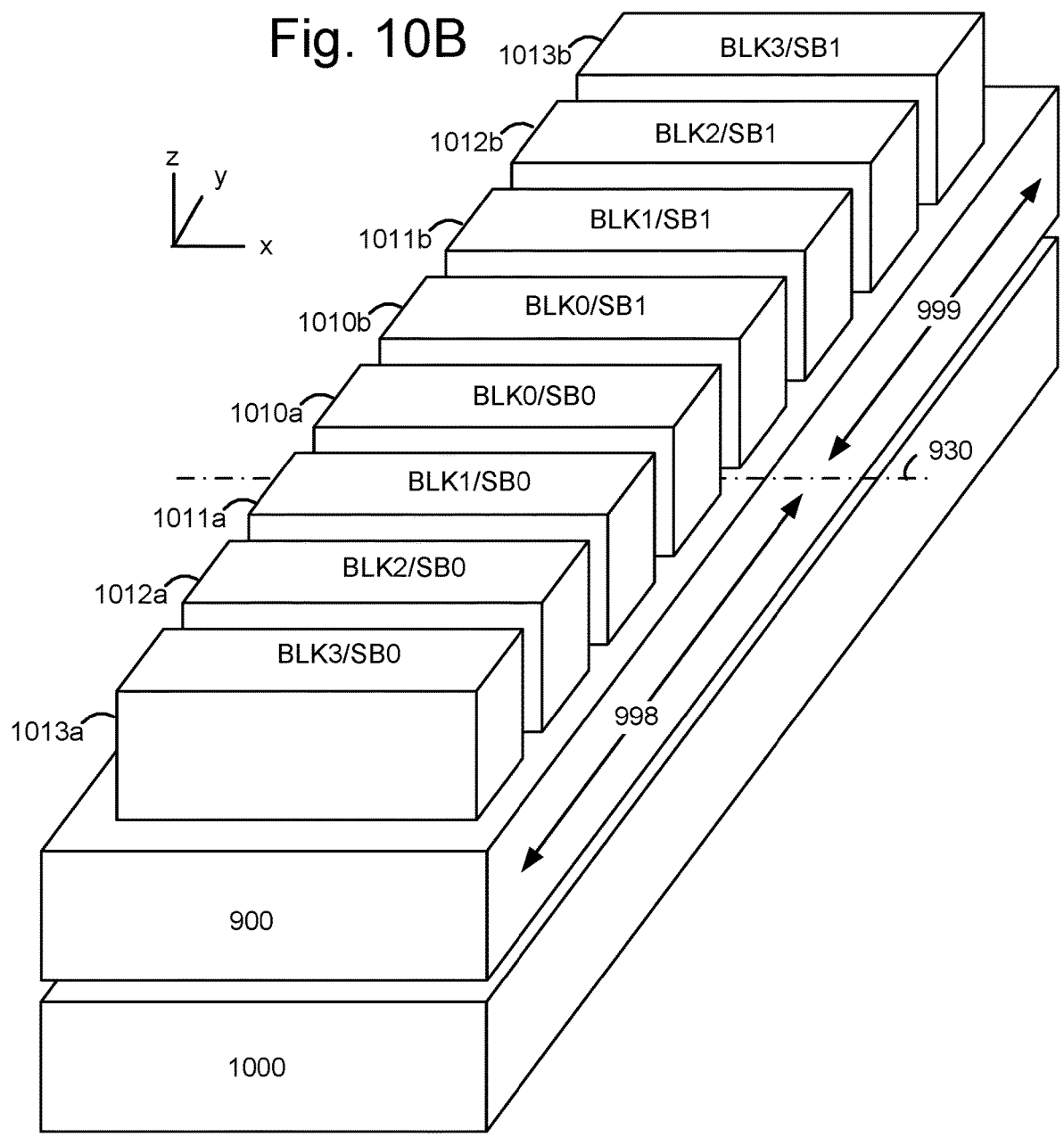

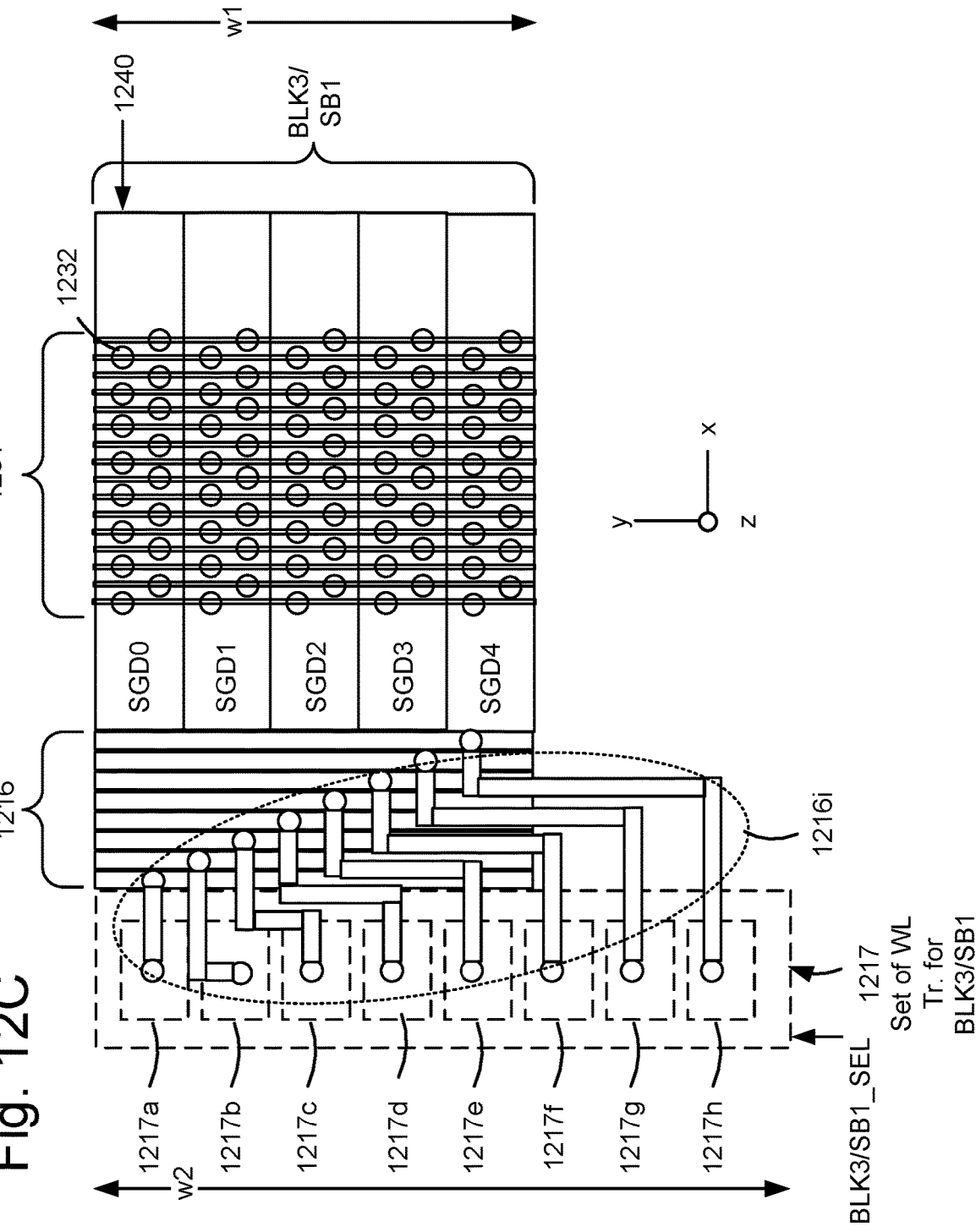

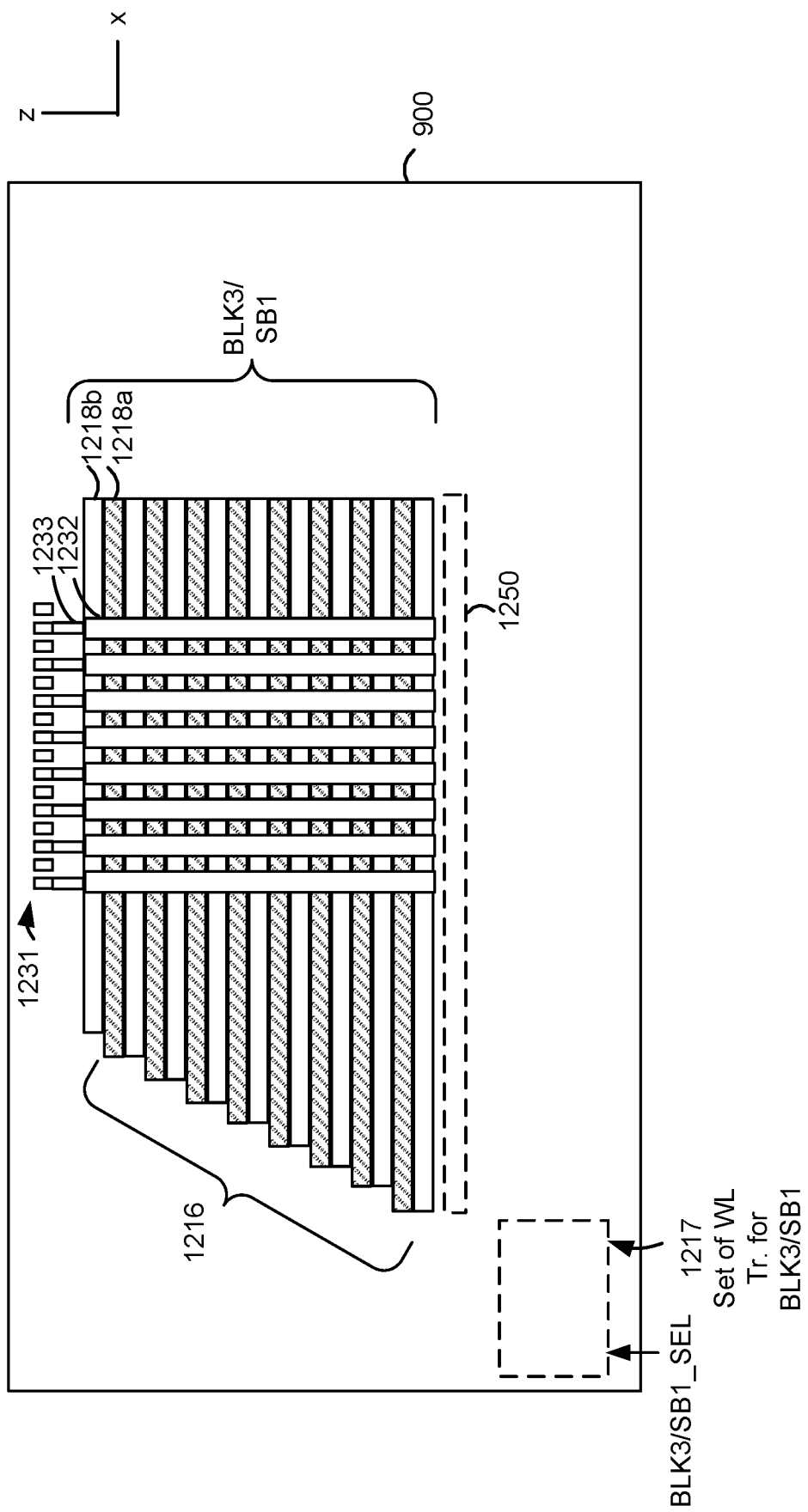

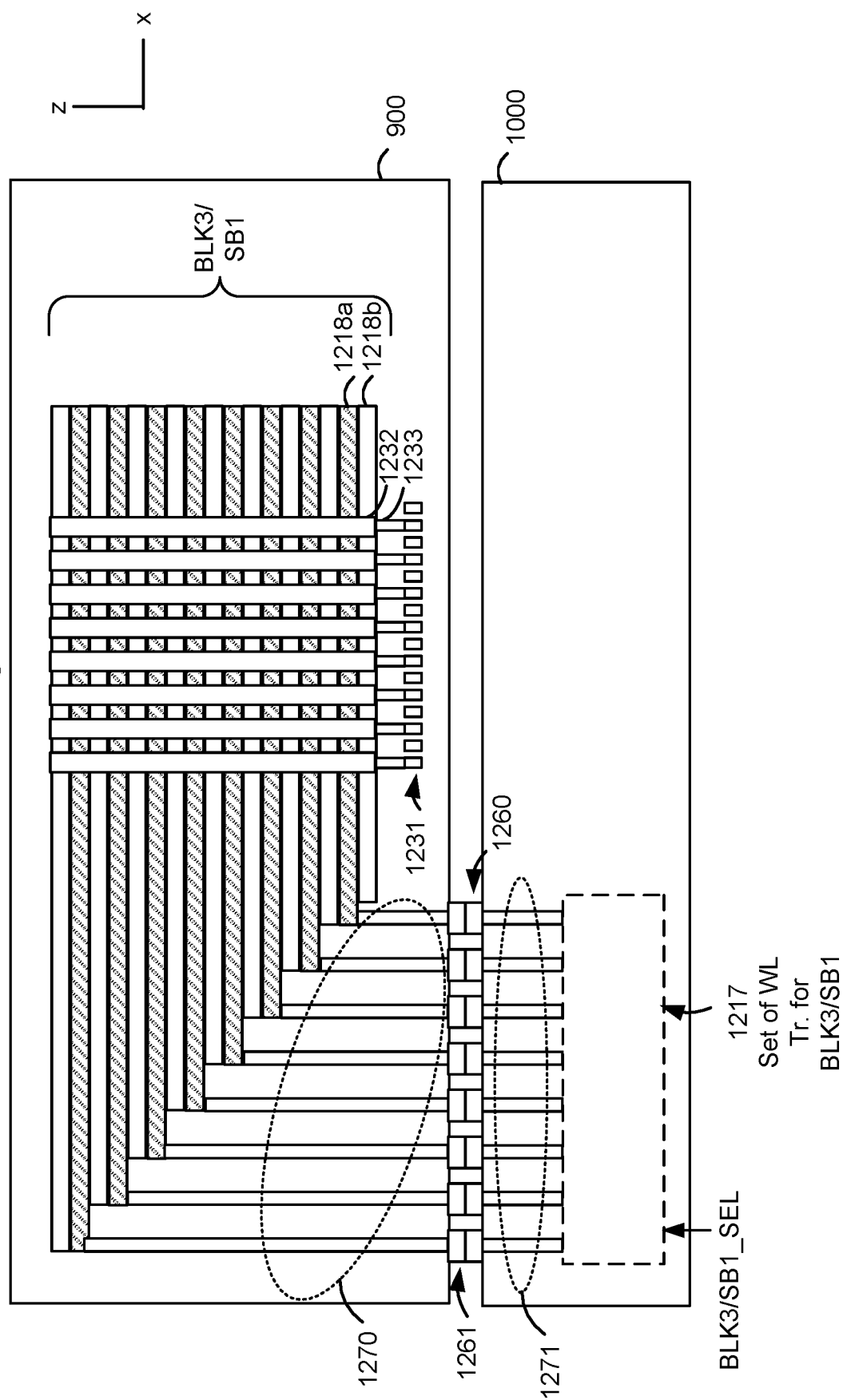

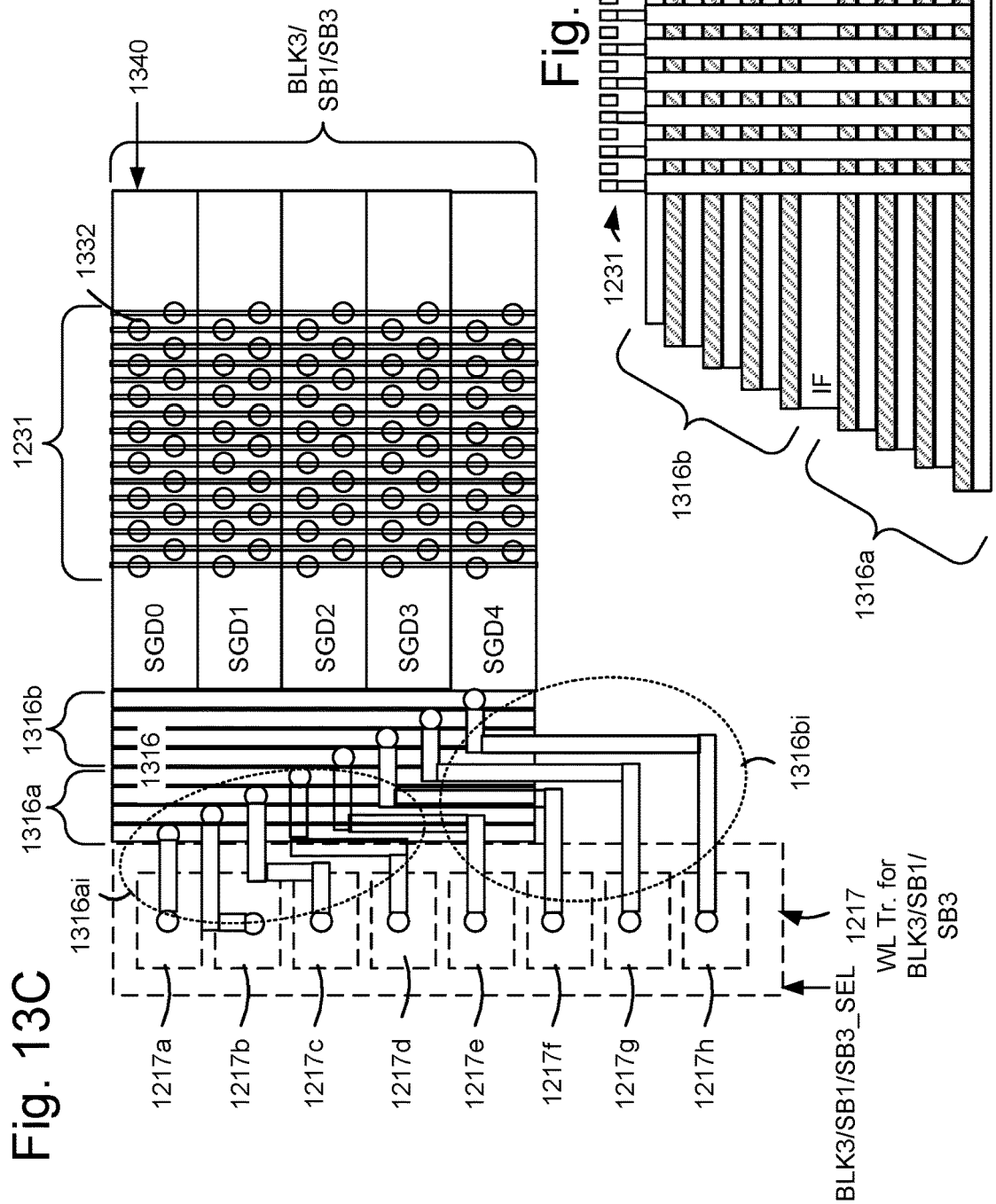

BLOCK CONFIGURATION FOR MEMORY DEVICE WITH SEPARATE SUB-BLOCKS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 9 depicts a floorplan of a memory device comprising blocks arranged in two planes, where each block is divided into separate sub-blocks.

FIG. 10A depicts an example perspective view of blocks arranged in a plane, consistent with FIG. 9, where each block comprises two separate sub-blocks, and the blocks and associated circuitry are on a common die 900.

FIG. 10B depicts an example perspective view of blocks arranged in a plane, consistent with FIG. 9, where each block comprises two separate sub-blocks, the blocks are arranged on a first die 900, and associated circuitry is arranged on a second die 1000.

FIG. 12C depicts an example arrangement of the sub-block BLK3/SB1 of FIG. 12A, including a staircase of word line layers and connections to word line switching transistors.

FIG. 12D depicts a cross-sectional view of the sub-block of FIG. 12C, where the sub-block and the set of word line switching transistors 1217 are on a common die 900, and the set of word line switching transistors 1217 is arranged laterally of a well region 1250 of the substrate.

FIG. 12E depicts a cross-sectional view of the sub-block of FIG. 12C, where the sub-block is on a first die 900 which is inverted and bonded to a second die 1000 which includes the set of word line switching transistors 1217.

FIG. 13C depicts an example arrangement of the sub-blocks BLK3/SB1 and BLK3/SB3 of FIG. 13A, including a staircase of word line layers and connections to one set of word line switching transistors.

FIG. 13D depicts a cross-sectional view of the sub-blocks of FIG. 13C along the line 1340.

DETAILED DESCRIPTION

Figure 2:
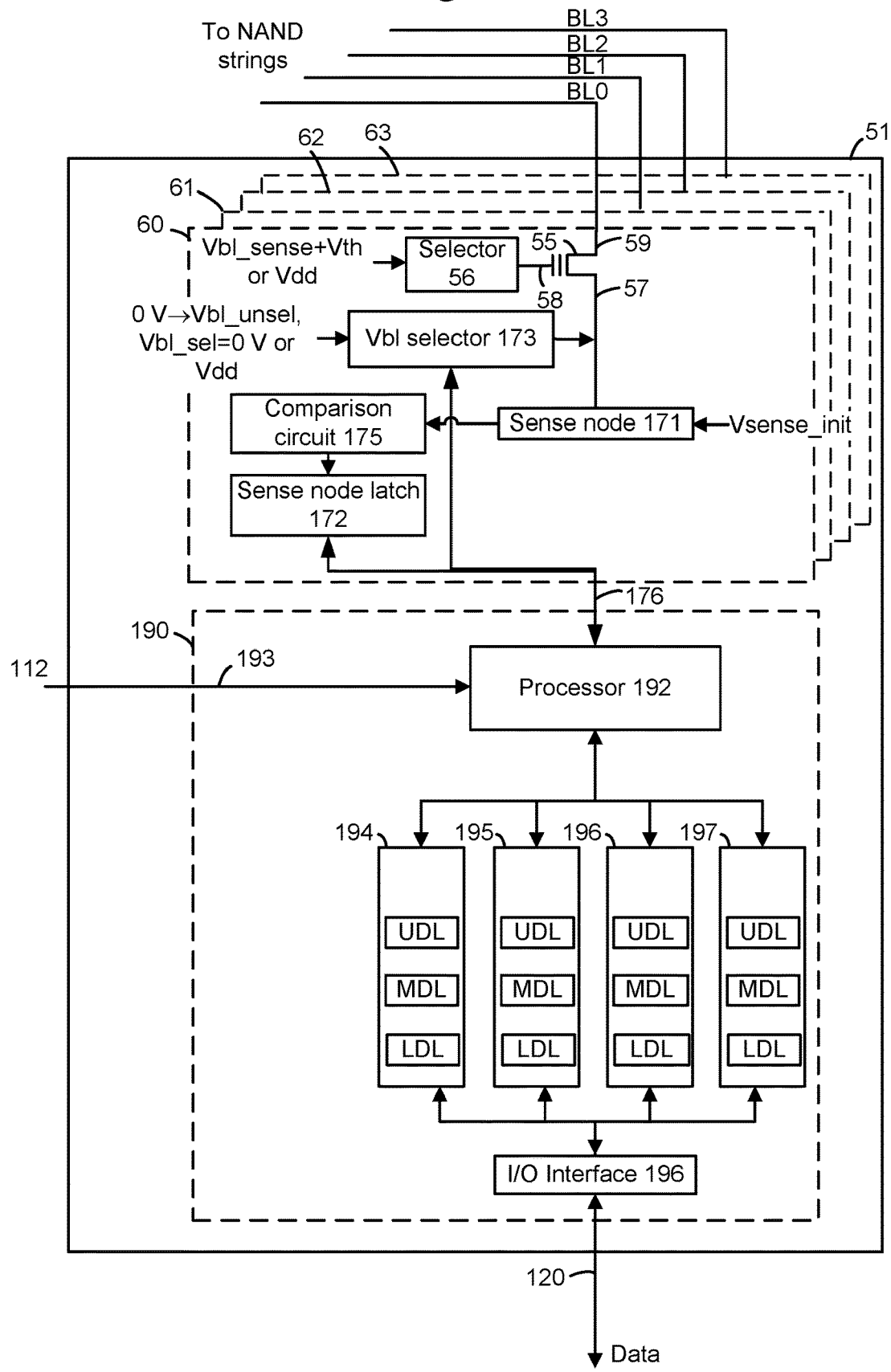
FIG. 2 is a block diagram depicting one embodiment of the sense block 51 of FIG. 1A.

A memory device is provided in which blocks of memory cells are divided into separate sub-blocks with respective sets of word line switching transistors and respective sets of bit lines. Techniques for operating the memory device are also provided.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Each NAND string includes various layers which extend vertically in the stack, such as a blocking oxide layer, a charge trapping layer, a tunneling layer and a channel layer.

To meet the need for increasing storage capacity, the number of word line layers and memory cells in a block can be increased. However, a larger block size results in a number of issues. For example, block yield can be reduced because, as the block size increases, the number of blocks on a chip decreases, and a single defective block represents a larger loss in the chip's capacity. Additionally, issues of block budget, data allocation efficiency/speed and garbage collection can be more challenging.

One approach is to treat the top and bottom halves of a block as respective sub-blocks. This can improve data handling by allowing the user to erase a portion of the block rather than the entire block, for example. Also, if there is a defective word line in one of the sub-blocks, the other sub-block may still be used. However, there is limited flexibility due to the use of common bit line voltage signals and word line voltage signals for the block. A further approach involves arranging the NAND strings of a block in different select gate or SGD groups, where the SGD transistors are connected to one another in each group. This allows independent reading for each group. Although, an operation on one group, such as a program or erase operation, can disturb the threshold voltages of the memory cells in the other groups. The memory cells can be operated in a single bit per cell mode to reduce the effects of the disturb but this reduces the data capacity.

Techniques provided herein address the above and other issues. In one approach, an apparatus is provided in which each block of memory cells is arranged in different sub-blocks, where each sub-block comprises a separate set of word lines and a separate set of word line switching transistors. The sub-blocks of the blocks can be arranged on a substrate on opposite sides of a dividing line. For example, each block can comprise a first sub-block on a first side of the dividing line and a second sub-block on a second side of the dividing line. A separate set of bit lines can be provided on each side of the dividing line as well. Each block has a row decoder which provides a common word line voltage signal to each sub-block of the block. However, each sub-block of a block has an independent set of word line switching transistors so that the common word line voltage signal can be passed or blocked independently for each sub-block.

In one approach, each block comprises two sub-blocks which are separated from one another on a substrate.

In another approach, each block comprises two pairs of sub-blocks which are separated from one another on a substrate. Each pair can comprise one sub-block atop another sub-block. In this case, one set of word line switching transistors can be shared by a pair of sub-blocks.

The blocks of memory cells and the sets of word line switching transistors can be provided on a common die, in one approach. In another approach, the blocks of memory cells are on a first die which is inverted and bonded to a second die which includes the sets of word line switching transistors. This approach provides more space for associated circuitry such as the word line switching transistors.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via row decoders 124 and by bit lines via a column decoder 132. The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 6A. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3A based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3A:
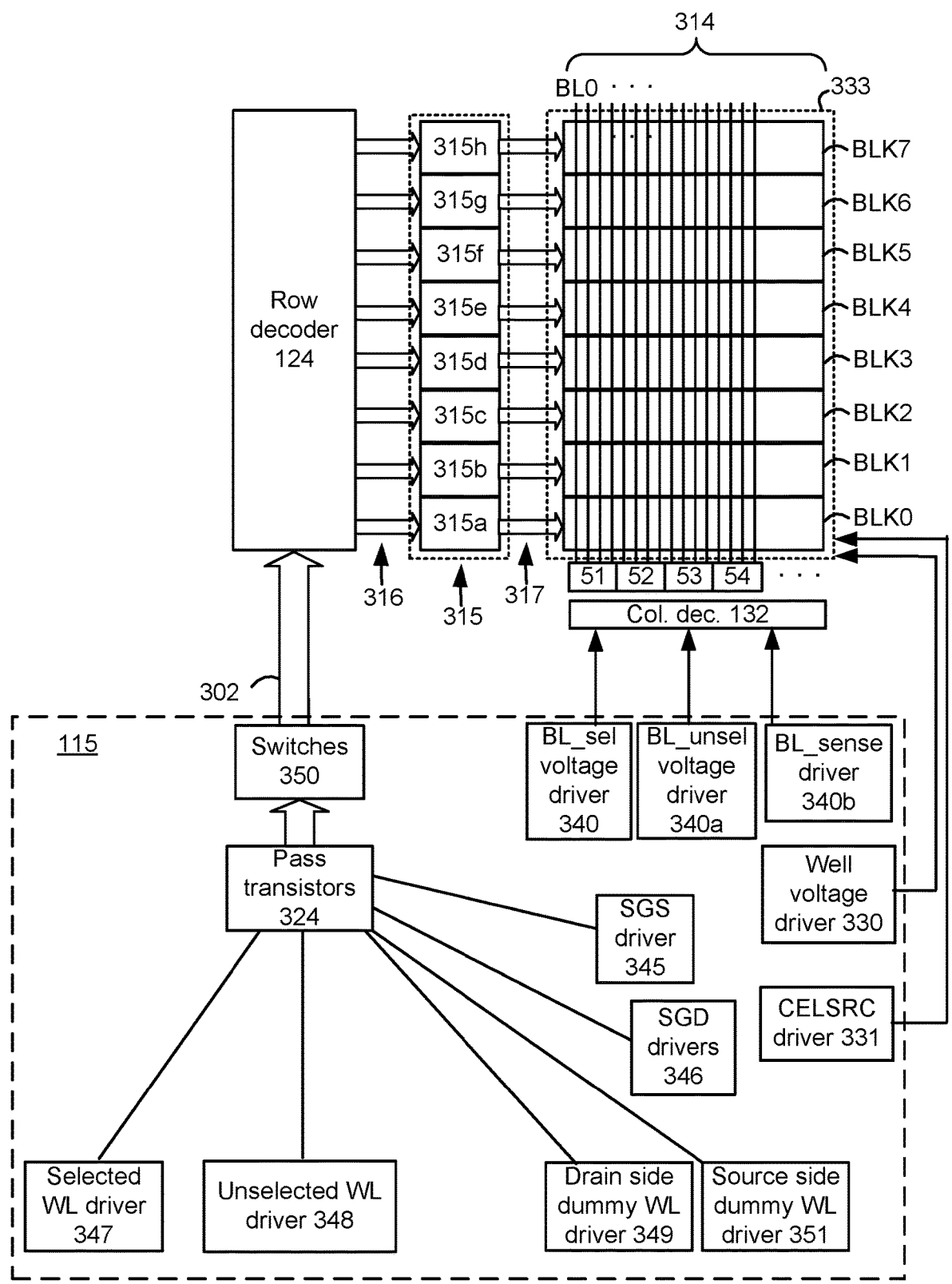
FIG. 3A depicts an example implementation of the power control circuit 115 of FIG. 1A for providing voltages to blocks of memory cells, where the blocks are arranged one after the other.
Figure 3B:
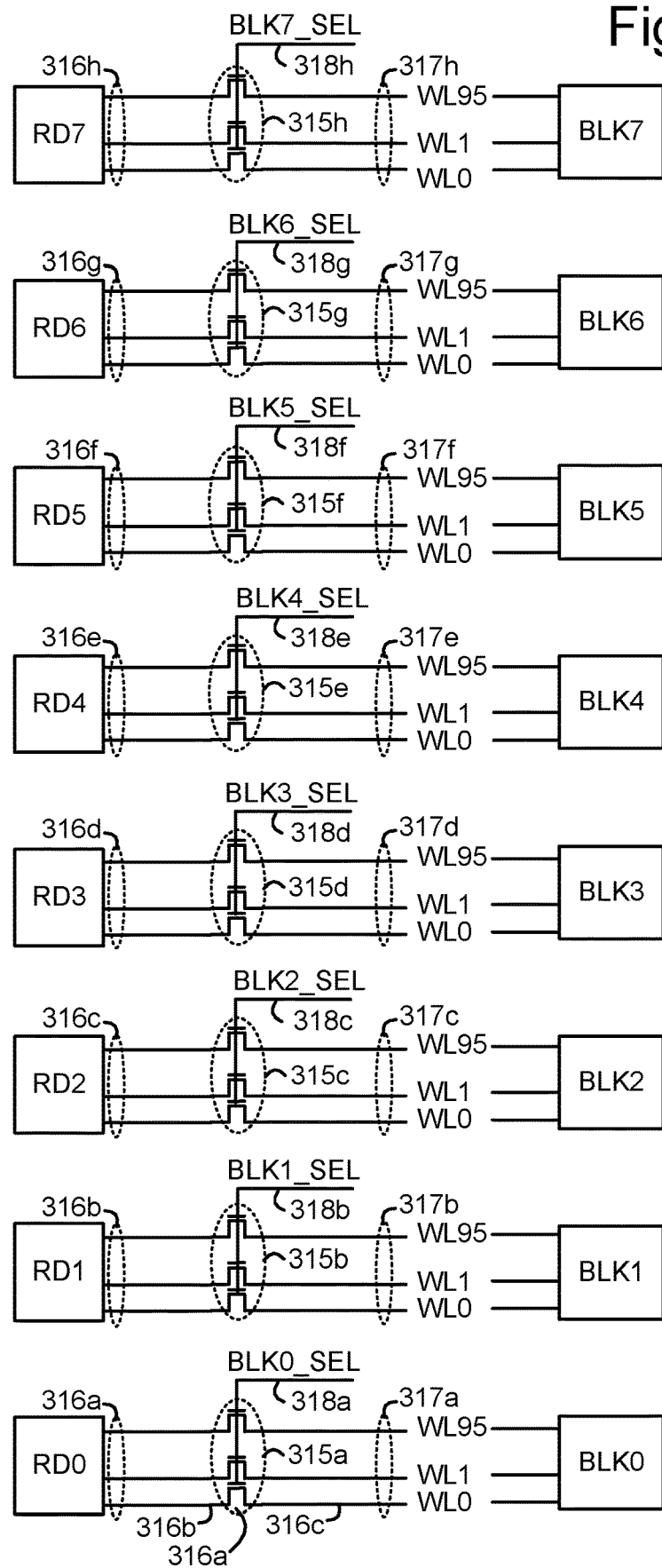
FIG. 3B depicts an example implementation of the row decoders and a set of word line select transistors for each of the blocks BLK0-BLK7 of FIG. 3A.

FIG. 3A depicts an example implementation of the power control circuit 115 of FIG. 1A for providing voltages to blocks of memory cells, where the blocks are arranged one after the other. The circuitry shown can be repeated for each plane of a die, in one approach. In this example, the memory structure 126 includes a set of eight blocks, BLK0-BLK7 on a plane 333 of a substrate, consistent with FIG. 4. Generally, the blocks can be in one or more planes. The row decoders 124 of FIG. 1A provide voltages to word lines and select gate control lines of each block via sets of word line voltage switching transistors 315 (pass transistors). In one approach, a separate row decoder is provided for each block. The row decoder provides a control signal on the conductive paths 316 to the word line voltage switching transistors which connect the row decoder to the word lines and select gate lines via the conductive paths 317. In one approach, the word line voltage switching transistors of each block are controlled by a common control gate voltage, such as depicted in FIG. 3B. Thus, the word line voltage switching transistors for a block are either all on (conductive) or off (non-conductive) at a given time. If the word line voltage switching transistors are on, a voltage from the row decoder is provided to the respective control gate lines and word lines of the block. If the word line voltage switching transistors are off, the row decoder is disconnected from the respective control gate lines or word lines so that the voltage floats on the respective control gate lines and word lines.

For instance, a block enable signal (BLK0_SEL to BLK7_SEL in FIG. 3B) is connected to each set of word line voltage switching transistors 315a-315h, which in turn are connected to select gate lines and word lines of BLK0-BLK7, respectively.

The row decoder can connect global control lines 302 to the conductive paths 316. Voltages are provided on the global control lines from a number of voltage drivers. Some of the voltage drivers may provide voltages to switches 350 which connect to the global control lines. Word line voltage switching transistors 324 are controlled to pass voltages from the voltage drivers to the switches 350.

A number of voltage drivers can be provided that are connected to the word line voltage switching transistors. For example, a selected data word line driver 347 provides a voltage signal on a data word line which is selected during a program or read operation. An unselected word line driver 348 provides a common voltage signal on each of the unselected data word lines. In another approach, multiple drivers can be used to provide different voltage signals on different groups of unselected word lines.

In some cases, additional drivers are provided for the WLn-1 and WLn+1, the adjacent word lines of WLn.

Dummy word line drivers are also provided. The drain side dummy word line driver 349 provides a voltage signal on WLDD, and the source side dummy word line driver 351 provides a voltage signal on WLDS.

The voltage drivers can also include a SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include SGD drivers 346 for different groups of SGD transistors of a block. The SGD drivers provide a voltage to a control line connected to the control gates of a SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 612*b* in the p-well region 612, e.g., via the conductive path 682. See FIG. 6A. In one approach, the p-well region 612 is common to a set of blocks on a plane. A set of bit lines 314 is also shared by the blocks. The bit lines may be driven by the column decoder 132 and connected to sense blocks 51, 52, 53, 54 . . . . A source line voltage driver, referred to as a CELSRC driver 331, provides a voltage Vcelsrc to a source end of a NAND string. For example, Vcelsrc can be provided to the n+ contact 612*c* in the p-well region 612, e.g., via the local interconnect 651 (source line) in FIG. 6A.

Bit line voltage drivers include voltage sources which provide voltages to the bit lines 314. BL_sel driver 340 is for selected bit lines in an operation, BL_unsel driver 340*a* is for unselected bit lines in an operation, and BL_sense driver 340*b* is for bit line involved in sensing.

FIG. 3B depicts an example implementation of the row decoders and a set of word line select transistors for each of the blocks BLK0-BLK7 of FIG. 3A. In this example, a set of word line switching transistors for each block is independently controlled by a respective enable signal. The row decoders RD0-RD7 are for BLK0-BLK7, respectively. BLK0-BLK7 each has a set of word line switching transistors 315*a*-315*h*, respectively, connected to its data word lines WL0-WL95. The dummy word lines and select gate lines are not depicted for simplicity. The sets of word line switching transistors 315*a*-315*h* are controlled by control signals BLK0_SEL to BLK7_SEL, respectively, on the control gate paths 318*a*-318*h*, respectively.

The row decoders RD0-RD7 can provide respective word line voltage signals on the conductive paths 316*a*-316*h*, respectively, and the conductive paths 317*a*-317*h*, respectively, if the associated control signal is at a turn on level.

The set of word line switching transistors 315*a* includes an example switching transistor 316*a* for WL0. RD0 provides a word line voltage signal to the switching transistor 316*a* on a conductive path 316*b*. If the switching transistor 316*a* is turned on, the word line voltage signal is passed to WL0 on the path 316*c*. If the switching transistor 316*a* is turned off, the word line voltage signal is not passed to WL0, and a voltage floats on the path 316*c*.

The configuration of FIG. 3B has various drawbacks as mentioned at the outset, including a common set of word lines and a common set of word line switching transistors for each block, such that a defect in the block can render the entire block unusable.

Figure 4:
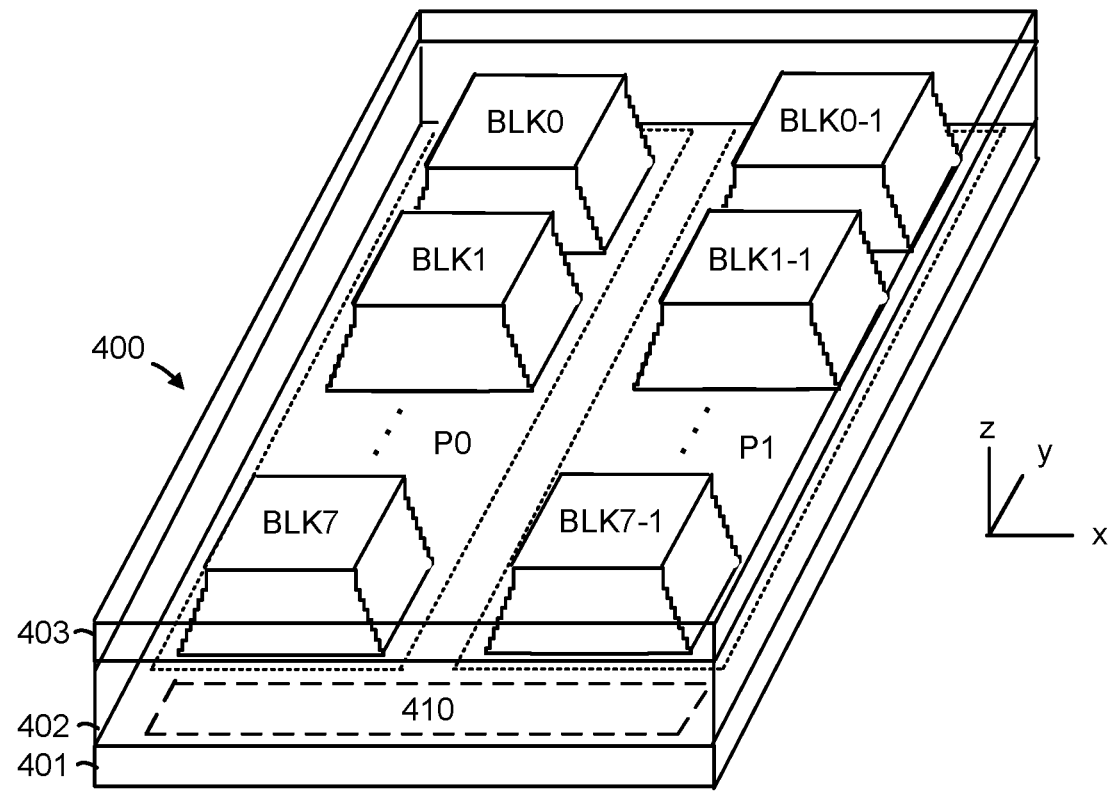
FIG. 4 is a perspective view of an example memory die 400 in which blocks are arranged one after another in respective planes P0 and P1, consistent with FIGS. 3A and 3B.

FIG. 4 is a perspective view of an example memory die 400 in which blocks are arranged one after another in respective planes P0 and P1, consistent with FIGS. 3A and 3B. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first set of blocks BLK0-BLK7 is formed in P0, and a second set of blocks BLK0-1 to BLK7-1 is formed in P1.

Control circuitry is located in a peripheral area 110 of the die in this example and may be shared among the planes, in one approach.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

Figure 6A:
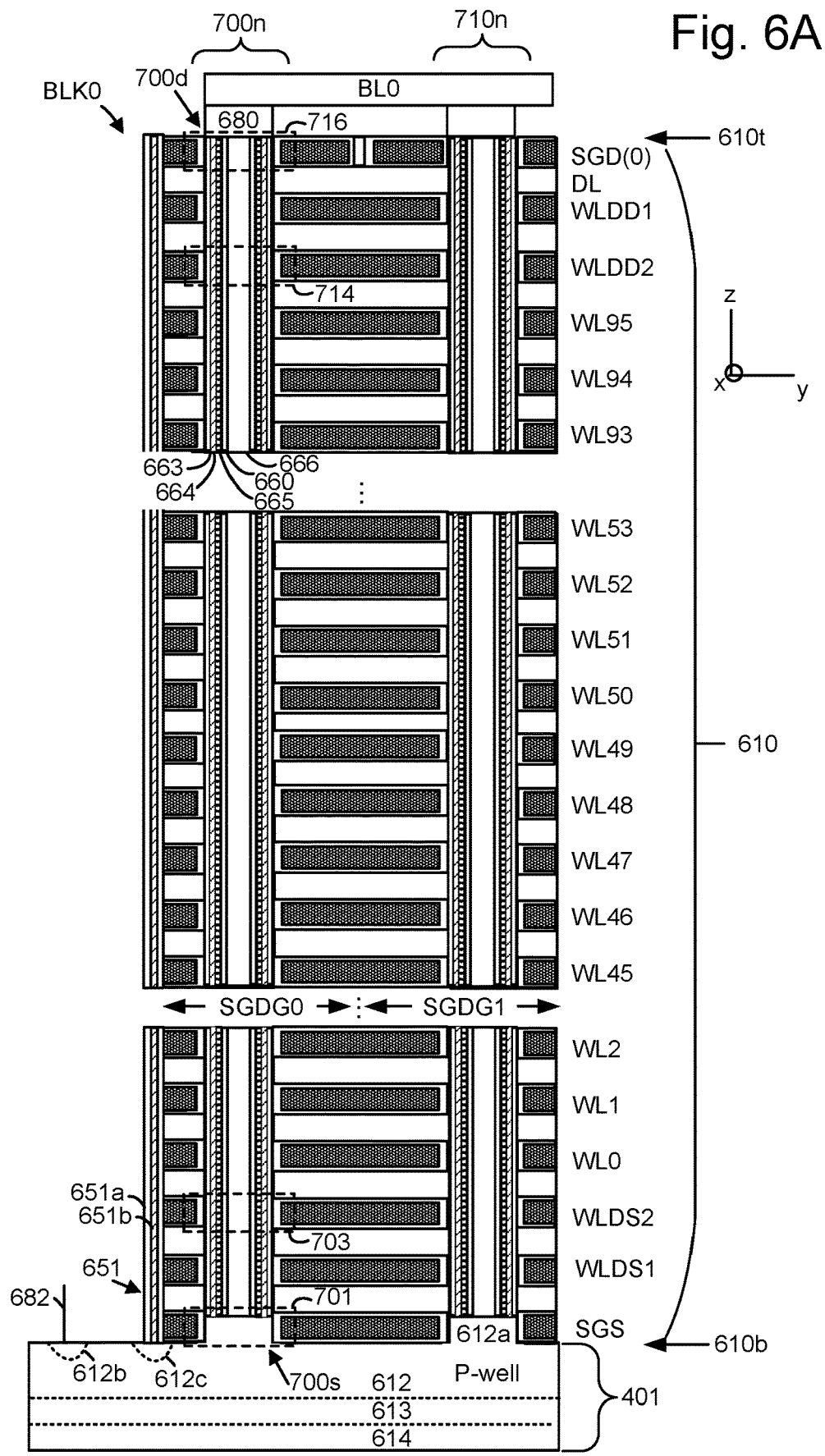
FIG. 6A depicts an example cross-sectional view of a portion of the block BLK0 of FIG. 4, including NAND strings 700n and 710n, in a single-tier stack.

In this example, the memory cells are formed in vertical NAND strings in the blocks, consistent with FIG. 6A. Each block comprises a stacked area of memory cells, where alternating levels of the stack represent word lines. In one possible approach, each block has opposing tiered sides in a staircase shape from which vertical contacts extend upward to an upper metal layer to form connections to conductive paths. While two planes are depicted as an example, other examples can use four or more planes. One plane per die is also possible.

Figure 5:
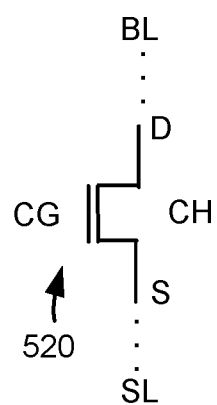
FIG. 5 depicts an example transistor 520 in the memory structure 126 of FIG. 1A.

FIG. 5 depicts an example transistor 520 in the memory structure 126 of FIG. 1A. The transistor comprises a control gate CG, a drain D, a source S and a channel CH and may represent a memory cell or a select gate transistor, for example. The control gate of the transistor is connected to a word line, the drain end of the transistor is connected to a bit line BL optionally via one or more other transistors in a NAND string, and the source end of the transistor is connected to a source line SL optionally via one or more other transistors in a NAND string.

FIG. 6A depicts an example cross-sectional view of a portion of the block BLK0 of FIG. 4, including NAND strings 700*n* and 710*n*, in a single-tier stack. In this example, the NAND strings 700*n* and 710*n* are in different SGD groups SGDG0 and SGDG1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. More WL layers, or fewer WL layers, can also be used in this technology for variations. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 6B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610*t* and bottom 610*b* of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 401. In one approach, the substrate includes a p-well region 612 connected to the source ends of the NAND strings. The p-well region may comprise epitaxial regions 612*a* which extend upward adjacent to the source-side select gate transistors. The p-well region can include an n+ contact 612*c* connected to a local interconnect 651 for receiving a source line voltage, and a p+ contact 612*b* connected to a conductive path 682 for receiving a p-well voltage. The local interconnect 651 can comprise a conductive material 651*b* such as metal surrounded by insulating material 651*a* to prevent conduction with the metal of the adjacent word lines. The p-well region is formed in an n-well 613, which in turn is formed in a p-type semiconductor region 614 of the substrate, in one possible implementation.

The NAND string 700*n* has a source end 700*s* at a bottom 610*b* of the stack 610, connected to the p-well. The NAND string 700*n* also has a drain end 700*d* at atop 610*t* of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651. For floating gate NAND memory, this causes the electrons to return to the channel from the charge trapping layer. For charge trapping NAND memory, hole injection during an erase operation neutralizes the electrons.

In this example, the SGS transistors do not include the multiple thin layers 660, 663, 664 and 665.

Figure 6B:
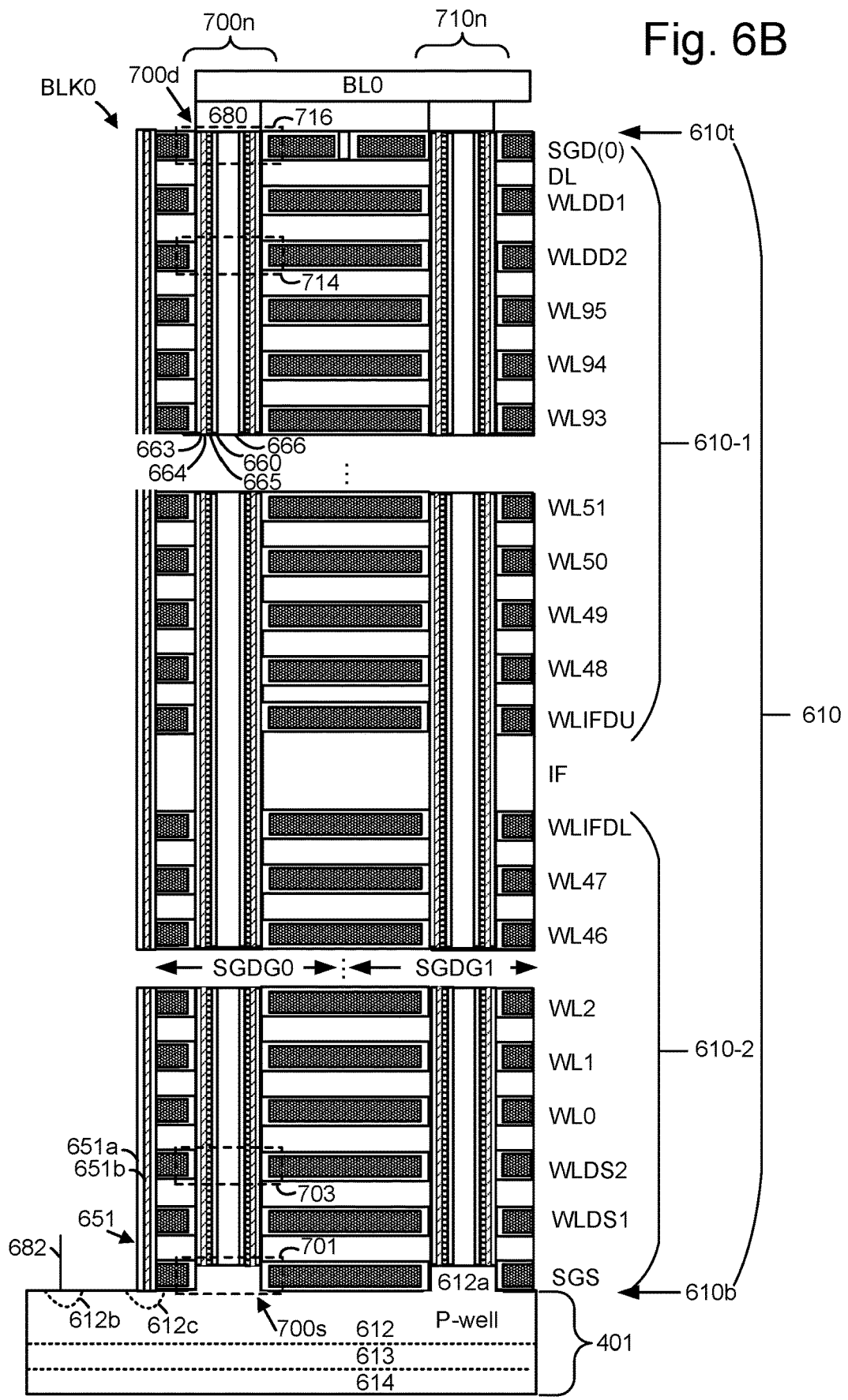
FIG. 6B depicts an example cross-sectional view of a portion of the block BLK0 of FIG. 4, including NAND strings 700n and 710n, in a two-tier stack comprising an upper tier 610-1 and a lower tier 610-2.

FIG. 6B depicts an example cross-sectional view of a portion of the block BLK0 of FIG. 4, including NAND strings 700*n* and 710*n*, in a two-tier stack comprising an upper tier 610-1 and a lower tier 610-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

As discussed further below, the upper and lower tiers can form respective sub-blocks of a block.

Figure 7:
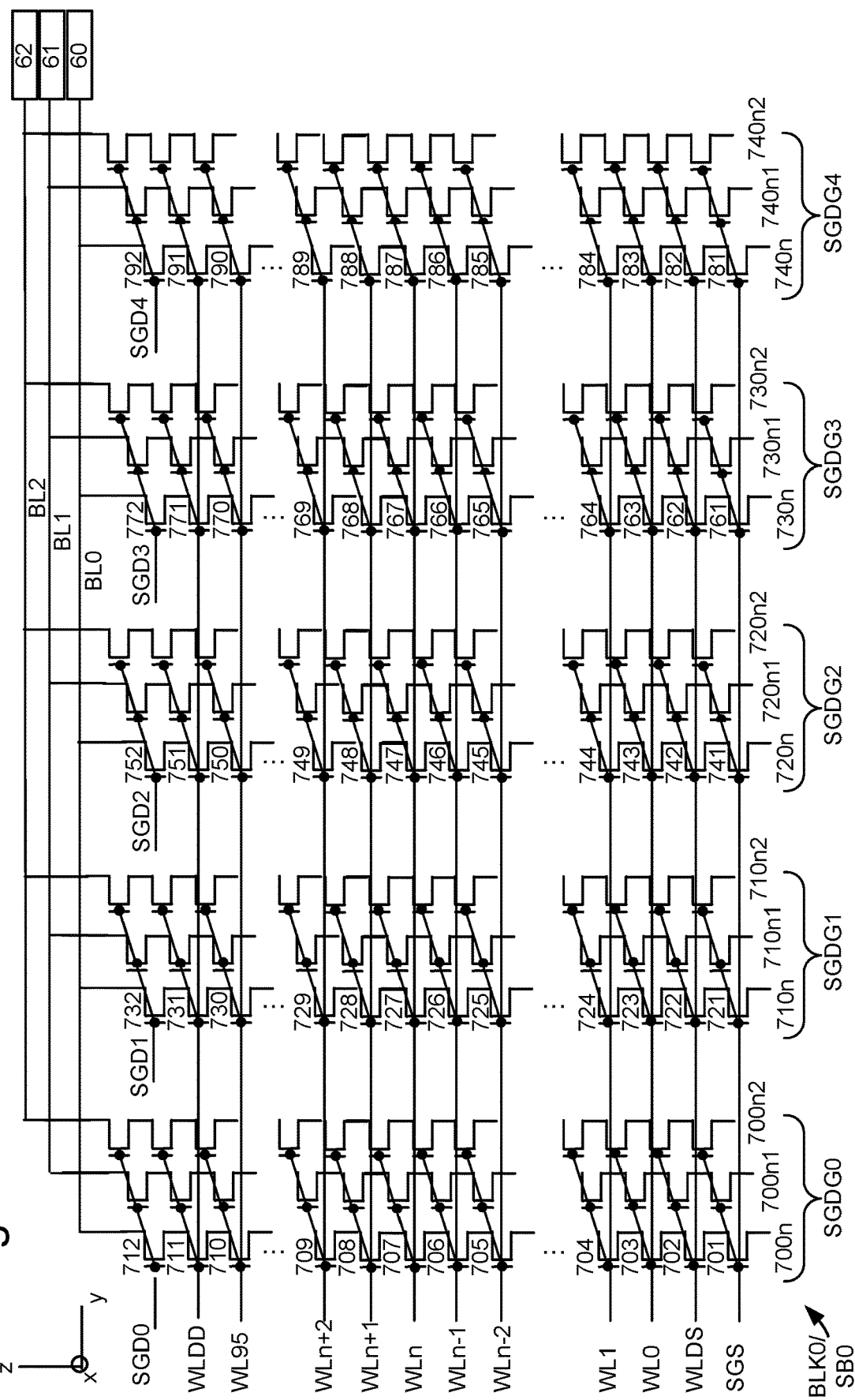
FIG. 7 depicts an example view of the block BLK0 of FIG. 4, with respective NAND strings arranged in SGD groups SGDG0-SGDG4, along with associated bit lines and sense circuits.

FIG. 7 depicts an example view of the block BLK0 of FIG. 4, with respective NAND strings arranged in SGD groups SGDG0-SGDG4, along with associated bit lines and sense circuits.

The set of word lines WL0-WL95 are connected to memory cells arranged in NAND strings. The NAND strings are arranged in select gate or SGD groups of the block in a 3D or vertical configuration. The block is consistent with FIGS. 6A and 6B. Each SGD group includes multiple NAND strings. Three example NAND strings are depicted, as a simplification. For example, SGDG0 comprises NAND strings 700*n*, 700*n*1 and 700*n*2, SGDG1 comprises NAND strings 710*n*, 710*n*1 and 710*n*2, SGDG2 comprises NAND strings 720*n*, 720*n*1 and 720*n*2, SGDG3 comprises NAND strings 730*n*, 730*n*1 and 730*n*2 and SGDG4 comprises NAND strings 740n, 740n1 and 740n2. The NAND strings have data word lines, dummy word lines and select gate lines. Each sub-block comprises a set of NAND strings which extend in the x direction and which have a common SGD line or control gate layer. In particular, the SGD lines or layers SGD0-SGD4 are in the select gate groups SGDG0-SGDG4, respectively.

Programming of the block may occur based on a word line programming order. One option is to program the memory cells in different portions of a word line which are in the different SGD groups, one group at a time, before programming the memory cells of the next word line. For example, this can involve programming WL0 in SGDG0, SGDG1, SGDG2, SGDG3 and then SGDG4, then programming WL1 in SGDG0, SGDG1, SGDG2, SGDG3 and then SGDG4, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can provide reduced neighbor word line interference.

Reading can occur for memory cells connected to a selected word line in a selected SGD group. Reading can occur one SGD group at a time.

In an erase operation, typically the entire block is erased, although a partial block erase is also possible. In one approach, an erase-verify test is performed for the entire block. In another approach, an erase-verify test is performed for one SGD group in a block.

Each NAND string comprises a plurality of memory cells between a SGS transistor and a SGD transistor, in this example. In other examples, more than one SGD and/or SGS transistor can be provided for each NAND string. The number of dummy memory cells can also vary. For example, the NAND string 700n includes a SGS transistor 701, a dummy memory cell 702, data memory cells 703-710, a dummy memory cell 711 and a SGD transistor 712. The NAND string 710n includes a SGS transistor 721, a dummy memory cell 722, data memory cells 723-730, a dummy memory cell 731 and a SGD transistor 732. The NAND string 720n includes a SGS transistor 741, a dummy memory cell 742, data memory cells 743-750, a dummy memory cell 751 and a SGD transistor 752. The NAND string 730n includes a SGS transistor 761, a dummy memory cell 762, data memory cells 763-770, a dummy memory cell 771 and a SGD transistor 772. The NAND string 740n includes a SGS transistor 781, a dummy memory cell 782, data memory cells 783-790, a dummy memory cell 791 and a SGD transistor 792.

This example depicts one SGD transistor at the drain end of each NAND string, and one SGS transistor at the source end of each NAND string. The SGD transistors in SGDG0-SGDG4 may be driven by separate control lines SGD0-SGD4, respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n, 730n and 740n in SGDG0-SGDG4, respectively, BL1 is connected to NAND strings 700n1, 710n1, 720n1, 730n1 and 740n1 in SGDG0-SGDG4, respectively, and BL2 is connected to NAND strings 700n2, 710n2, 720n2, 730n2 and 740n2 in SGDG0-SGDG4, respectively. Each bit line is also connected to a respective sense circuit, consistent with the sense circuits of FIG. 2. For example, BL0-BL2 are connected to sense circuits 60-62, respectively.

Figure 8:
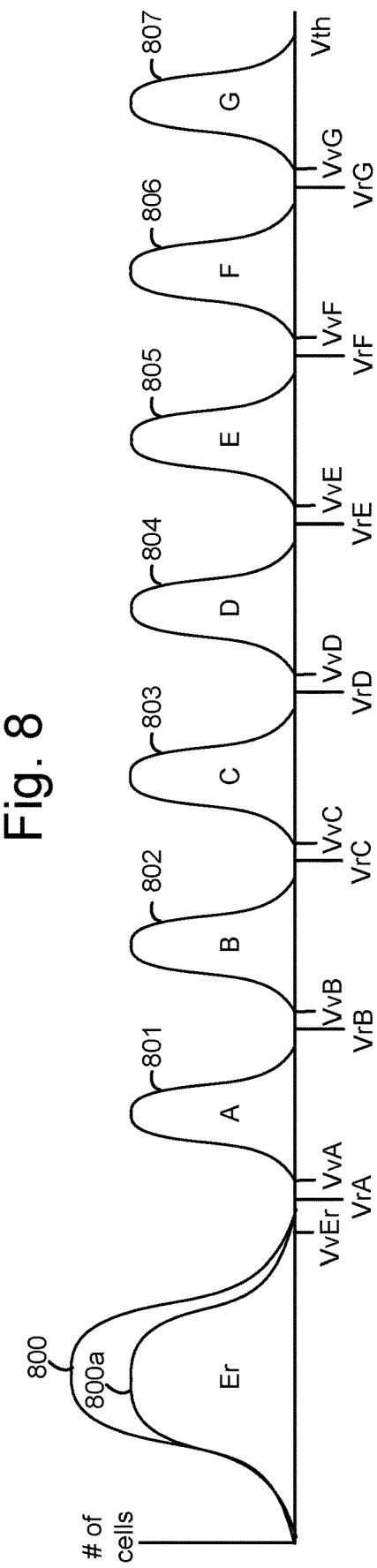
FIG. 8 depicts threshold voltage (Vth) distributions for an eight-state memory device.

FIG. 8 depicts threshold voltage (Vth) distributions for an eight-state memory device. Eight data states, or three bits per cell, are depicted as an example. The techniques herein can apply to other modes, including one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution of plot 800 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state, as represented by Vth distribution 800a, and are not programmed. Most of the memory cells are programmed to higher states, such as A-F, in this example, as represented by Vth distributions 801-807, respectively. These memory cells are subject to verify tests using verify voltages of VvA-VvG.

In a read operation, the memory cells can be read by applying the read voltages VrA-VrG applied to the selected word line. The data which is programmed or read can be arranged in pages. In one approach, one page of data is read at a time. For example, with eight data states a lower page of data can be read using VrA and VrE, a middle page of data can be read using VrB, VrD and VrF, and an upper page of data can be read using VrC and VrG.

FIG. 9 depicts a floorplan of a memory device comprising blocks arranged in two planes, where each block is divided into separate sub-blocks. A first plane 910 and a second plane 920 are depicted. Each plane includes a first side 998 and a second side 999 on opposing sides of an imaginary dividing line 930. The line can be a central point which divides the planes in half in the y direction, for example. The y direction is a direction in which bit lines extend. Each block includes one or more sub-blocks on the first side and one or more sub-blocks on the second side. A first set of bit lines can extend on the first side while a second set of bit lines extends on the second side.

For example, in the first plane 910, a block BLK0 includes a first sub-block BLK0/SB0 on the first side and a second sub-block BLK0/SB1 on the second side. A block BLK1 includes a first sub-block BLK1/SB0 on the first side and a second sub-block BLK1/SB1 on the second side. A block BLK2 includes a first sub-block BLK2/SB0 on the first side and a second sub-block BLK2/SB1 on the second side. A block BLK3 includes a first sub-block BLK3/SB0 on the first side and a second sub-block BLK3/SB1 on the second side. The first sub-blocks of the blocks are arranged laterally one after the other in the –y direction on the plane, while the second sub-blocks of the blocks are arranged laterally one after the other in the opposite, y direction on the plane. Each block may be considered to be a logical block as it is divided into separate sub-blocks, where each sub-block comprises an independent set of word lines, an independent set of word line switching transistors, and is connected to an independent set of bit lines. The sub-blocks of a block are related in that they receive common word line voltage signals from a common row decoder. Each block may have a separate row decoder.

For the blocks in the plane 910, regions 901 and 902 can be used for circuitry including word line switching transistors. Further, a region 903 on the first side can include sense circuits for the sub-blocks on the first side, while a region 905 on the second side can include sense circuits for the sub-blocks on the second side. A region 904 which is centrally located in the plane, in one approach, can be used for circuitry such as row decoders, a column decoder and analog circuits. In one approach, the regions 903-905 are on a second die while the blocks are on a first die 900. The second die is under the first die. This approach provides greater flexibility in locating the circuitry, compared to an approach in which the circuitry is on the same die as the blocks of memory cells, such as in the peripheral region 410 of FIG. 4.

The second plane 920 can include a similar arrangement of sub-blocks and circuitry. Specifically, for the blocks in the plane 920, regions 921 and 922 can be used for circuitry including word line switching transistors. A region 923 on the first side can include sense circuits for the sub-blocks on the first side, while a region 925 on the second side can include sense circuits for the sub-blocks on the second side. A region 924 can be used for circuitry such as row decoders, a column decoder and analog circuits.

FIG. 10A depicts an example perspective view of blocks arranged in a plane, consistent with FIG. 9, where each block comprises two separate sub-blocks, and the blocks and associated circuitry are on a common die 900. As depicted in FIG. 9, the sub-blocks can be arranged laterally one after another on a substrate, on both sides of the dividing line 930. The first side 998 includes the first sub-blocks 1010a-1013a, e.g., BLK0/SB0-BLK3/SB0, respectively. The second side 999 includes the second sub-blocks 1010b-1013b, e.g., BLK0/SB1-BLK3/SB1, respectively.

FIG. 10B depicts an example perspective view of blocks arranged in a plane, consistent with FIG. 9, where each block comprises two separate sub-blocks, the blocks are arranged on a first die 900, and associated circuitry is arranged on a second die 1000. As mentioned, by arranging the circuitry such as the word line switching transistors on a second die, while the blocks of memory cells are on a first die, additional space is obtained for the circuitry. This facilitates the provision of independent sets of word line switching transistors for each sub-block or pair of sub-blocks. The two dice are bonded together, such that conductive paths can extend between the word lines and the word line switching transistors. See also FIG. 12E. The one-die approach of FIG. 10A is also feasible and may be less complex but generally has an extra space requirement.

Figure 11A:
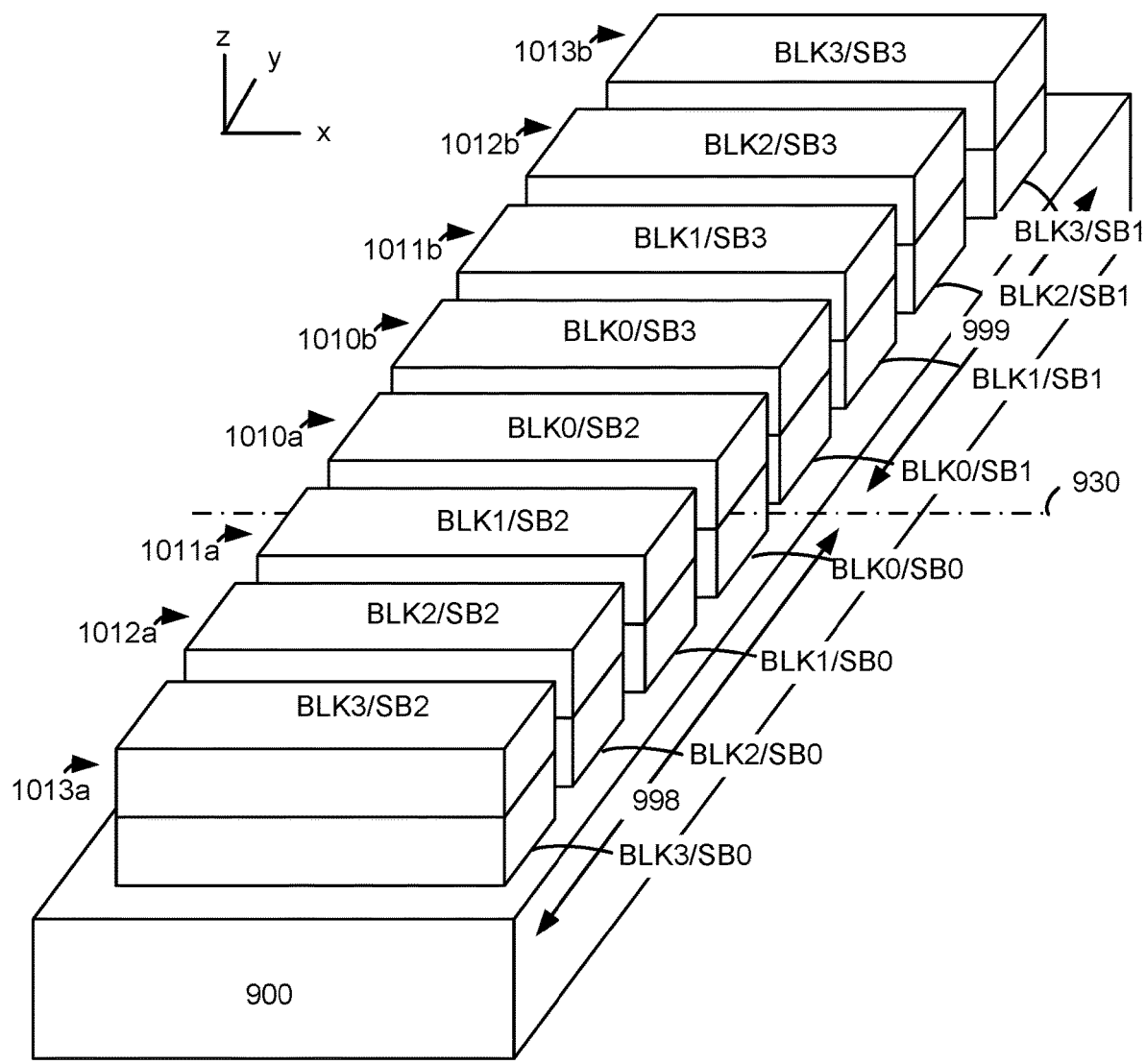
FIG. 11A depicts another example perspective view of blocks arranged in a plane, consistent with FIG. 9, where each block comprises two separate pairs of vertically arranged sub-blocks, and the blocks and associated circuitry are on a common die 900.

FIG. 11A depicts another example perspective view of blocks arranged in a plane, consistent with FIG. 9, where each block comprises two separate pairs of vertically arranged sub-blocks, and the blocks and associated circuitry are on a common die 900. Each block comprises four sub-blocks in total, with two on the first side 998 of the dividing line 930 and two on the second side 999 of the dividing line. Additionally, two sub-blocks are arranged vertically, one atop the other. The two sub-blocks can be formed from a stack of word line layers, where one sub-block comprises a lower half or other fraction of the stack and the other sub-block comprises an upper half or other remaining portion of the stack. For example, in the two-tier stack of FIG. 6B, one sub-block can comprise the lower tier 610-2 and the other sub-block can comprise the upper tier 610-1.

As detailed further below, each sub-block can have an independent set of word line switching transistors. Or, the two sub-blocks can share a set of set of word line switching transistors.

Figure 11B:
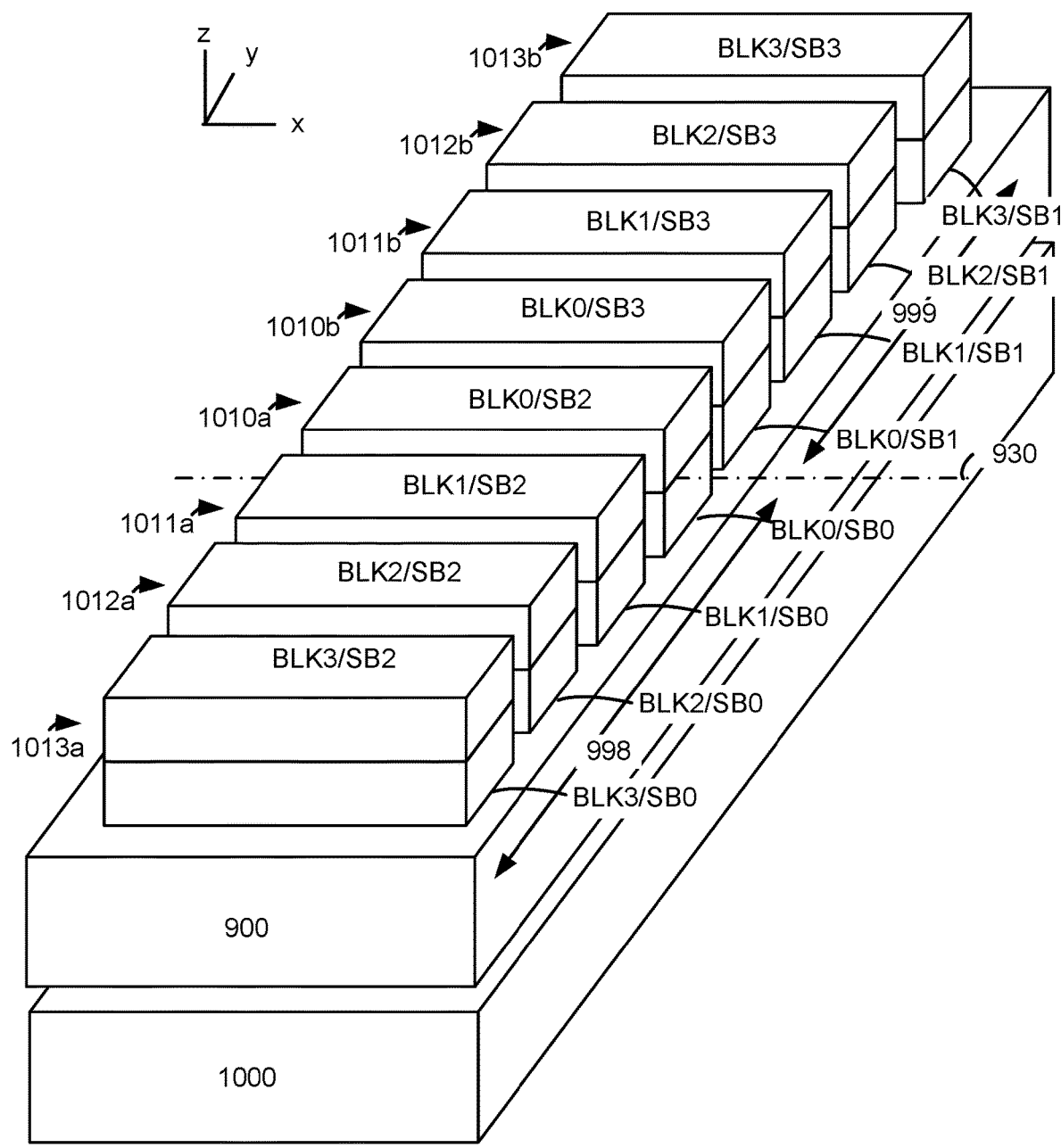
FIG. 11B depicts an example perspective view of blocks arranged in a plane, consistent with FIG. 9, where each block comprises two separate pairs of vertically arranged sub-blocks, the blocks are arranged on a first die 900, and associated circuitry is arranged on a second die 1000.

FIG. 11B depicts an example perspective view of blocks arranged in a plane, consistent with FIG. 9, where each block comprises two separate pairs of vertically arranged sub-blocks, the blocks are arranged on a first die 900, and associated circuitry is arranged on a second die 1000. This configuration is similar to that of FIG. 10B in that the associated circuitry of the blocks can be arranged on a separate die than a die which contains the blocks.

Figure 12A:
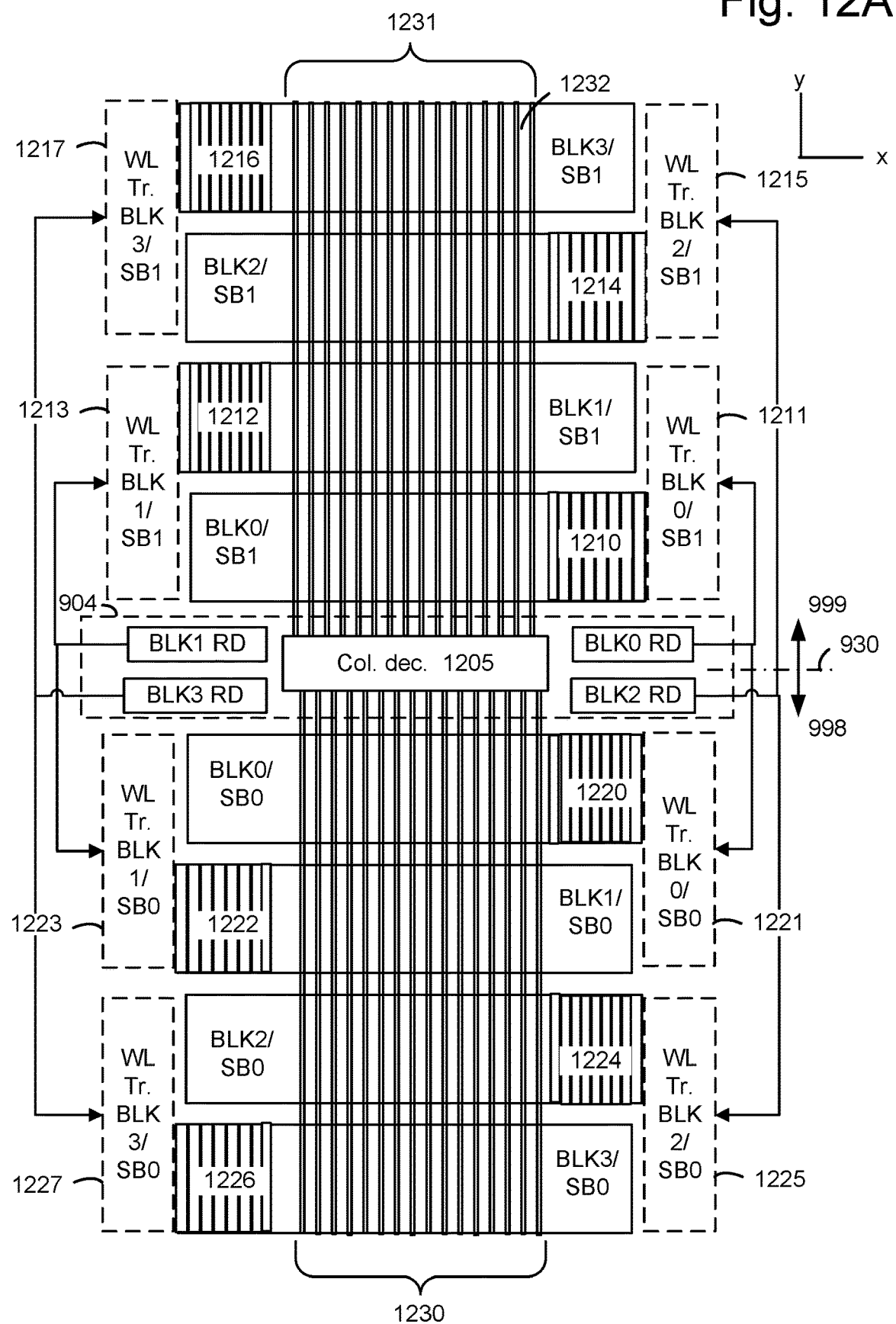
FIG. 12A depicts an example arrangement of sub-blocks, consistent with FIG. 10A or 10B, where each sub-block has a respective independent set of word line switching transistors.

FIG. 12A depicts an example arrangement of sub-blocks, consistent with FIG. 10A or 10B, where each sub-block has a respective independent set of word line switching transistors. The view is a top view in the x-y plane. The dashed line regions include the word switching transistors (WL Tr.) and the region 904 from FIG. 9. These regions can be in a die which is below the die containing the sub-blocks, as discussed. The region 904 can extend directly under the sub-blocks but is depicted as being between the sub-blocks for simplicity. The dividing line 930 is depicted along with the first side 998 and the second side 999. The region 904 can be centrally located to allow for efficient communication between the row decoders and the column decoder with the sub-blocks on both sides of the planes.

The first sub-blocks include BLK0/SB0-BLK3/SB0 and the second sub-blocks include BLK0/SB1-BLK3/SB1. Four blocks are depicted as an example. One or more blocks can be provided. Additionally, one plane of blocks is depicted. Blocks can be provided in one or more planes can be provided on a die.

Each sub-block can be elongated in the x direction and include SGD groups of NAND strings and memory cells such as depicted in FIG. 12C. The sub-blocks on the first and second sides are connected to first and second sets of bit lines 1230 and 1231, respectively. The first set of bit lines extend on the first side to the first sub-blocks of memory cells, and the second set of bit lines extends on the second side to the second sub-blocks of memory cells.

Each set of bit lines is depicted as having only sixteen bit lines for simplicity. Each sub-block has a staircase on one side, for example, which allows for electrical connections between the word lines and a set of word line switching transistors. In one approach, the set of word line switching transistors is in a region which is adjacent to the staircase. The set of word line switching transistors may be on a different die than the die which includes the sub-blocks, such as depicted in FIG. 12E.

For example, on the first side 998, the sub-block BLK0/SB0 has a staircase 1220 and an associated set of word line switching transistors (WL Tr.) 1221 in a respective region of a die. The sub-block BLK1/SB0 has a staircase 1222 and an associated set of word line switching transistors 1223. The sub-block BLK2/SB0 has a staircase 1224 and an associated set of word line switching transistors 1225. The sub-block BLK3/SB0 has a staircase 1226 and an associated set of word line switching transistors 1227.

On the second side 999, the sub-block BLK0/SB1 has a staircase 1210 and an associated set of word line switching transistors 1211. The sub-block BLK1/SB1 has a staircase 1212 and an associated set of word line switching transistors 1213. The sub-block BLK2/SB1 has a staircase 1214 and an associated set of word line switching transistors 1215. The sub-block BLK3/SB1 has a staircase 1216 and an associated set of word line switching transistors 1217.

For efficient use of space, the regions which comprise the set of word line switching transistors, and the staircase which is used to connect to the word line switching transistors, are on a common side of the sub-blocks, and this side alternates for consecutive sub-blocks in the −y and +y directions.

In one approach, each first sub-block of memory cells comprises a stack of alternating word line layers and dielectric layers and a staircase formed by the alternating word line layers and dielectric layers at a side of the stack; the side of the stack at which the staircase is formed alternates between one side and another, opposing side for consecutive first sub-blocks of memory cells of the plurality of blocks; and for each first sub-block of memory cells, the respective set of word line switching transistors is adjacent to the staircase. Similarly, each second sub-block of memory cells comprises a stack of alternating word line layers and dielectric layers and a staircase formed by the alternating word line layers and dielectric layers at a side of the stack; the side of the stack at which the staircase is formed alternates between one side and another, opposing side for consecutive first sub-blocks of memory cells of the plurality of blocks; and for each second sub-block of memory cells, the respective set of word line switching transistors is adjacent to the staircase.

The region 904 includes a row decoder (RD) for each of the blocks. For example, BLK0 RD is used to provide common word line voltage signals to the sets of word line switching transistors 1211 and 1221. BLK1 RD is used to provide common word line voltage signals to the sets of word line switching transistors 1213 and 1223. BLK2 RD is used to provide common word line voltage signals to the sets of word line switching transistors 1215 and 1225. BLK3 RD is used to provide a common word line voltage signals to the sets of word line switching transistors 1217 and 1227. Efficiency is obtained by sharing a word line voltage signal among the two sub-blocks of each block, while flexibility is obtained by providing separate sets of bit lines for the two sub-blocks of each block. The region 904 also includes a column decoder 1205 (col. dec.) which provides voltage signals on the sets of bit lines 1230 and 1231.

Figure 12B:
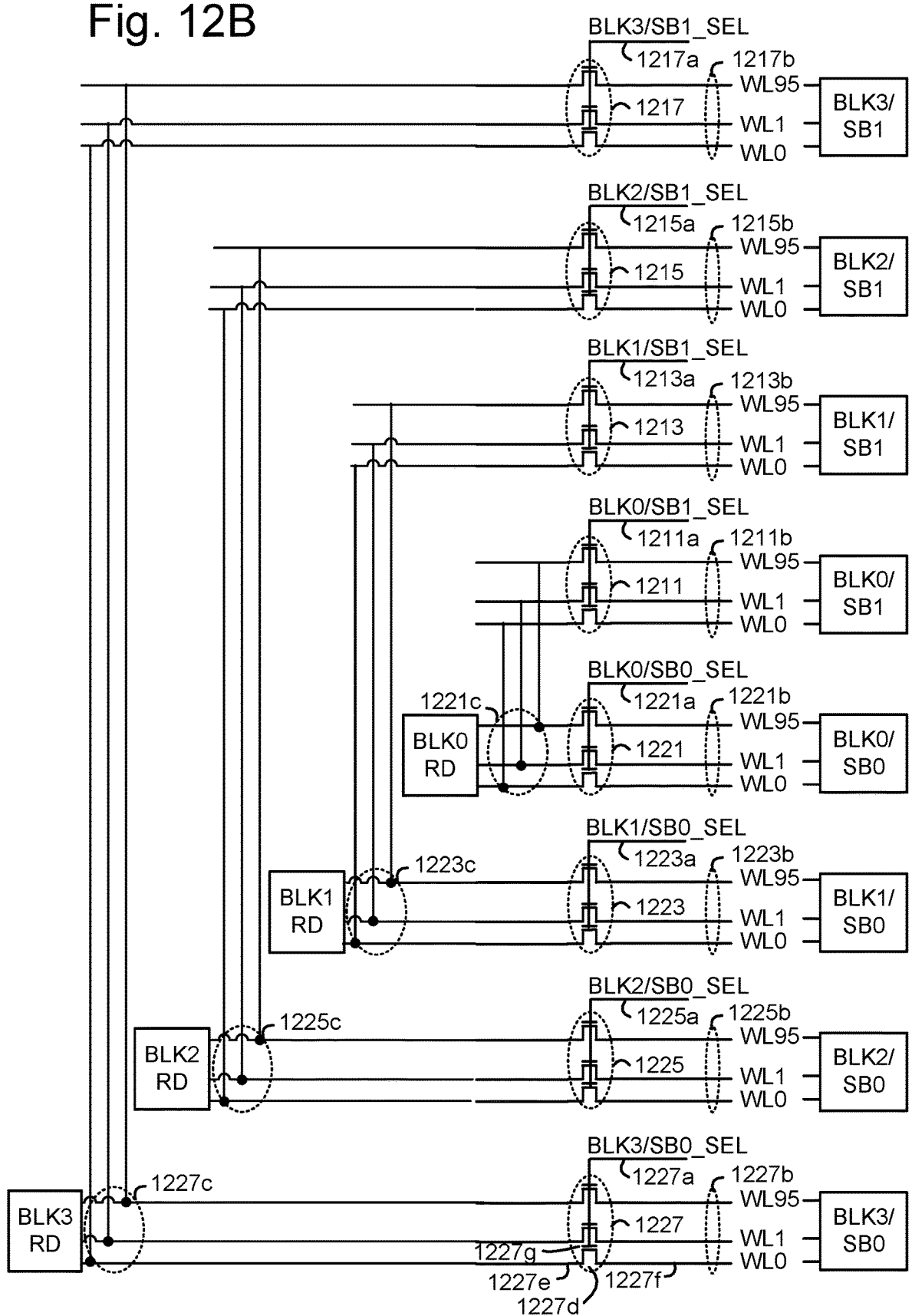
FIG. 12B depicts an example arrangement of the row decoders, word line switching transistors and sub-blocks of FIG. 12A.

FIG. 12B depicts an example arrangement of the row decoders, word line switching transistors and sub-blocks of FIG. 12A. As before, the sub-blocks are denoted by BLK0/SB0-BLK3/SB0 and BLK0/SB1-BLK3/SB1 and the row decoders are denoted by BLK0 RD-BLK3 RD. Sets of word line switching transistors 1221, 1223, 1225 and 1227 are associated with BLK0/SB0, BLK1/SB0, BLK2/SB0 and BLK3/SB0, respectively. Sets of word line switching transistors 1211, 1213, 1215 and 1217 are associated with BLK0/SB1, BLK1/SB1, BLK2/SB1 and BLK3/SB1, respectively.

Each set of word line switching transistors includes a word line switching transistor for each word line, e.g., WL0-WL95 in this example. The transistors may have their control gates connected to a common path on which a control signal is applied, e.g., a select or enable signal. For example, the transistors may be nMOSFETs such that a high control signal provides the transistors in a conductive state and a low control signal provides the transistors in a non-conductive state. When a transistor is in a conductive state, it allows a word line voltage signal to pass to a word line. For example, in the set of word line switching transistors 1227, when the transistor 1227*d* is in a conductive state, a conductive path 1227*e* is connected to a conductive path 1227*f* and to WL0 in BLK3/SB0.

The control signals BLK0/SB0_SEL, BLK1/SB0_SEL, BLK2/SB0_SEL and BLK3/SB0_SEL on paths 1221*a*, 1223*a*, 1225*a* and 1227*a* are used to control the sets of word line switching transistors 1221, 1223, 1225 and 1227, respectively. Similarly, the control signals BLK0/SB1_SEL, BLK1/SB1_SEL, BLK2/SB1_SEL and BLK3/SB1_SEL on paths 1211*a*, 1213*a*, 1215*a* and 1217*a* are used to control the sets of word line switching transistors 1211, 1213, 1215 and 1217, respectively.

Generally, a plurality of word line switching transistors of each respective set of word line switching transistors comprise control gates connected to one another; the plurality of word line switching transistors of each respective set of word line switching transistors are configured to turn on or off together based on a respective control signal; and the control signals are independent for each respective set of word line switching transistors. See the example control gate 1227*g* of the transistor 1227*d*.

While switching transistors for data word lines are shown, switching transistors can also be provided for dummy word lines and select gate transistors. These other switching transistors can have their control gates connected to the control gates of the data word line transistors.

As mentioned, each row decoder provides a common word line voltage signal to each portion of the respective block. For example, BLK0 RD provides a common word line voltage signal via conductive paths 1221*c* to the sets of word line switching transistors 1211 and 1221. BLK1 RD provides a common word line voltage signal via conductive paths 1223*c* to the sets of word line switching transistors 1213 and 1223. BLK2 RD provides a common word line voltage signal via conductive paths 1225*c* to the sets of word line switching transistors 1215 and 1225. BLK3 RD provides a common word line voltage signal via conductive paths 1227*c* to the sets of word line switching transistors 1217 and 1227.

FIG. 12C depicts an example arrangement of the sub-block BLK3/SB1 of FIG. 12A, including a staircase of word line layers and connections to word line switching transistors. The sub-block includes five SGD groups of NAND strings, consistent with FIG. 7, as an example. One or more select gate groups may be provided per sub-block. Each SGD group includes an independently drivable select gate layer, e.g., SGD0-SGD4. The NAND strings are depicted by circles and include a NAND string 1232. There is one NAND string per bit line in each SGD group. The NAND strings can be arranged in staggered rows to save space. Each bit line can extend directly over one NAND string in each SGD group to facilitate an electrical connection by a vertical conductive via. A cross-sectional view of the sub-block along the line 1240 is provided in FIG. 12D.

In one approach, each first or second portion of memory cells comprises alternating word line layers and dielectric layers, and a plurality of select gate layers above the alternating word line layers and dielectric layers.

The staircase 1216 is depicted at the left side of the sub-block and includes eight word line layers in a simplified example. Conductive paths 1216*i* or interconnects are provided which electrically connect each word line to a respective word line switching transistor. The conductive paths can include vertical components in the z direction and horizontal components in the x and y direction. The set of word line switching transistors 1217 includes individual transistors 1217*a*-1217*h* which are each connected to a respective word line. The control signal BLK3/SB1_SEL is also depicted.

The staircase and sub-block have a width w1 in the y direction, while the set of word line switching transistors 1217 has a larger width w2 in the y direction is this example. In one approach, each staircase has a width from one side of the staircase to another, opposing side of the staircase; for each first portion of memory cells, the respective set of word line switching transistors is in a region having a width greater than the width of the staircase; and for each second portion of memory cells, the respective set of word line switching transistors is in a region having a width greater than the width of the staircase. As mentioned, sufficient space can be allocated to the sets of word line switching transistors by alternating the position of the sets of word line switching transistors for consecutive sub-blocks in a plane.

The sets of word line switching transistors can be on the same die as the blocks of memory cells such as depicted in FIG. 12D, or on a separate die such as depicted in FIG. 12E.

FIG. 12D depicts a cross-sectional view of the sub-block of FIG. 12C, where the sub-block and the set of word line switching transistors 1217 are on a common die 900, and the set of word line switching transistors 1217 is arranged laterally of a well region 1250 of the substrate. The alternating conductive and dielectric layers of the stack are depicted, including an example word line layer 1218a and dielectric layer 1218b. The word line layers are shown by shaded rectangles while the dielectric layers are shown by unshaded rectangles. For simplicity, just eight word line layers are depicted. The layers form the staircase 1216 in which each word line is exposed to allow electrical connections to the set of word line switching transistors 1217 to be formed. The control signal BLK3/SB1_SEL is also depicted. The set of word line switching transistors is at a lower height in the substrate than the sub-block in this example. In another example, the set of word line switching transistors are at the same height as the sub-block. Due to the use of a common die, the set of word line switching transistors may be located laterally of the well region 1250, in the x direction, since conductive paths can be formed outside the well region to electrically connect the word lines and the set of word line switching transistors. It could be more complex to form these conductive paths through the well region. The set of word line switching transistors could also be located below the well region 1250, where conductive paths to the transistors are routed around the well.

The set of bit lines 1231 extends over the NAND strings. Due to the staggered rows, the cross-section has just eight NAND strings instead of sixteen. An example NAND string 1232 is connected to a bit line via a respective via 1233.

FIG. 12E depicts a cross-sectional view of the sub-block of FIG. 12C, where the sub-block is on a first die 900 which is inverted and bonded to a second die 1000 which includes the set of word line switching transistors 1217. The sub-block may be fabricated on the first die before the first die is inverted. Conductive paths 1270 connect the word lines to a set of bond pads 1261 of the first die. These bond pads are connected to a set of bond pads 1260 of the second die 100 and from there to conductive paths 1271 to the set of word line switching transistors 1217. A space between the dies may be filled with an epoxy or other resin or polymer. By providing the set of word line switching transistors in a separate die, and inverting the sub-block, there is space available to position the set of word line switching transistors directly under the sub-block.

In one approach, a plurality of blocks of memory cells are arranged on a first die; and the sets of word line switching transistors are arranged on a second die connected to the first die at bond pads of the first and second die.

Figure 13A:
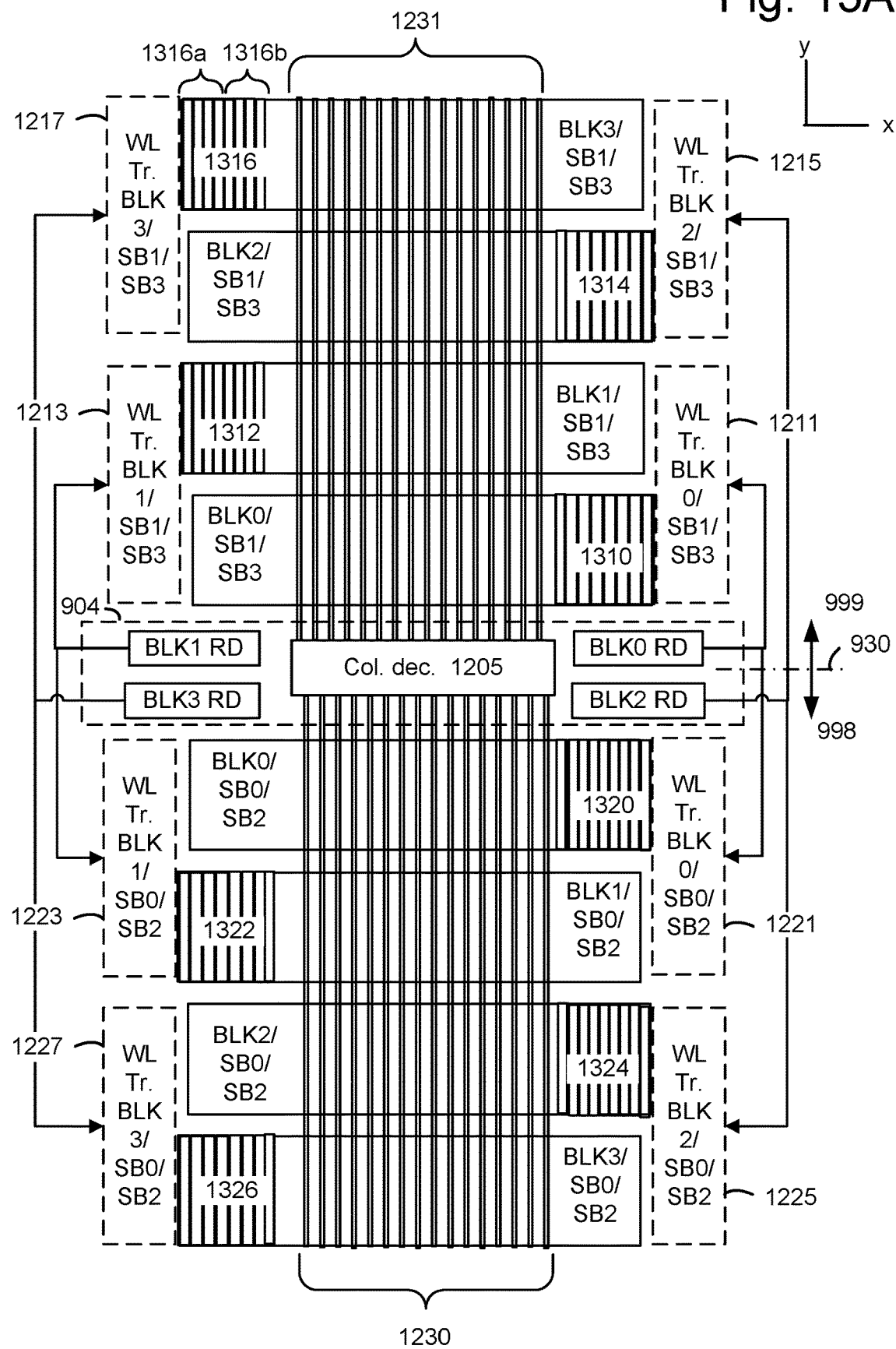
FIG. 13A depicts an example arrangement of sub-blocks, consistent with FIG. 11, where each pair of vertically arranged sub-blocks has a respective independent set of word line switching transistors.

FIG. 13A depicts an example arrangement of sub-blocks, consistent with FIG. 11, where each pair of vertically arranged sub-blocks has a respective independent set of word line switching transistors. That is, a respective set of word line switching transistors is shared by the two sub-blocks. The sub-blocks can be consistent with FIG. 6B, for example, where one sub-block is provided by the lower tier of a stack and another sub-block is provided by the upper tier of the stack. An operation can be performed on just one of the two tiers at a time or on both tiers concurrently.

On the first side 998 of the plane, BLK0/SB0/SB2, BLK1/SB0/SB2, BLK2/SB0/SB2 and BLK3/SB0/SB2 each denote a pair of vertically arranged sub-blocks, where SB2 is above SB0. For example, SB2 can be an upper tier and SB0 can be a lower tier. On the second side 999 of the plane, BLK0/SB1/SB3, BLK1/SB1/SB3, BLK2/SB1/SB3 and BLK3/SB1/SB3 each denote a pair of vertically arranged sub-blocks, where SB3 is above SB1. For example, SB3 can be an upper tier and SB1 can be a lower tier.

As before, each sub-block has a staircase on one side. For example, on the first side, BLK0/SB0/SB2, BLK1/SB0/SB2, BLK2/SB0/SB2 and BLK3/SB0/SB2 have respective staircases 1320, 1322, 1324 and 1326 and are associated with the respective sets of word line switching transistors 1221, 1223, 1225 and 1227. On the second side, BLK0/SB1/SB3, BLK1/SB1/SB3, BLK2/SB1/SB3 and BLK3/SB1/SB3 have respective staircases 1310, 1312, 1314 and 1316 and are associated with the respective sets of word line switching transistors 1211, 1213, 1215 and 1217.

In this case, the staircase has two regions, including lower and upper regions. For example, the staircase 1316 of BLK3/SB1/SB3 has a lower region 1316a and an upper region 1316b. See also FIGS. 13C and 13D.

As before, BLK0 RD is used to provide common word line voltage signals to the sets of word line switching transistors 1211 and 1221. BLK1 RD is used to provide common word line voltage signals to the sets of word line switching transistors 1213 and 1223. BLK2 RD is used to provide common word line voltage signals to the sets of word line switching transistors 1215 and 1225. BLK3 RD is used to provide a common word line voltage signals to the sets of word line switching transistors 1217 and 1227. The column decoder 1205 provides voltage signals on the sets of bit lines 1230 and 1231.

Figure 13B:
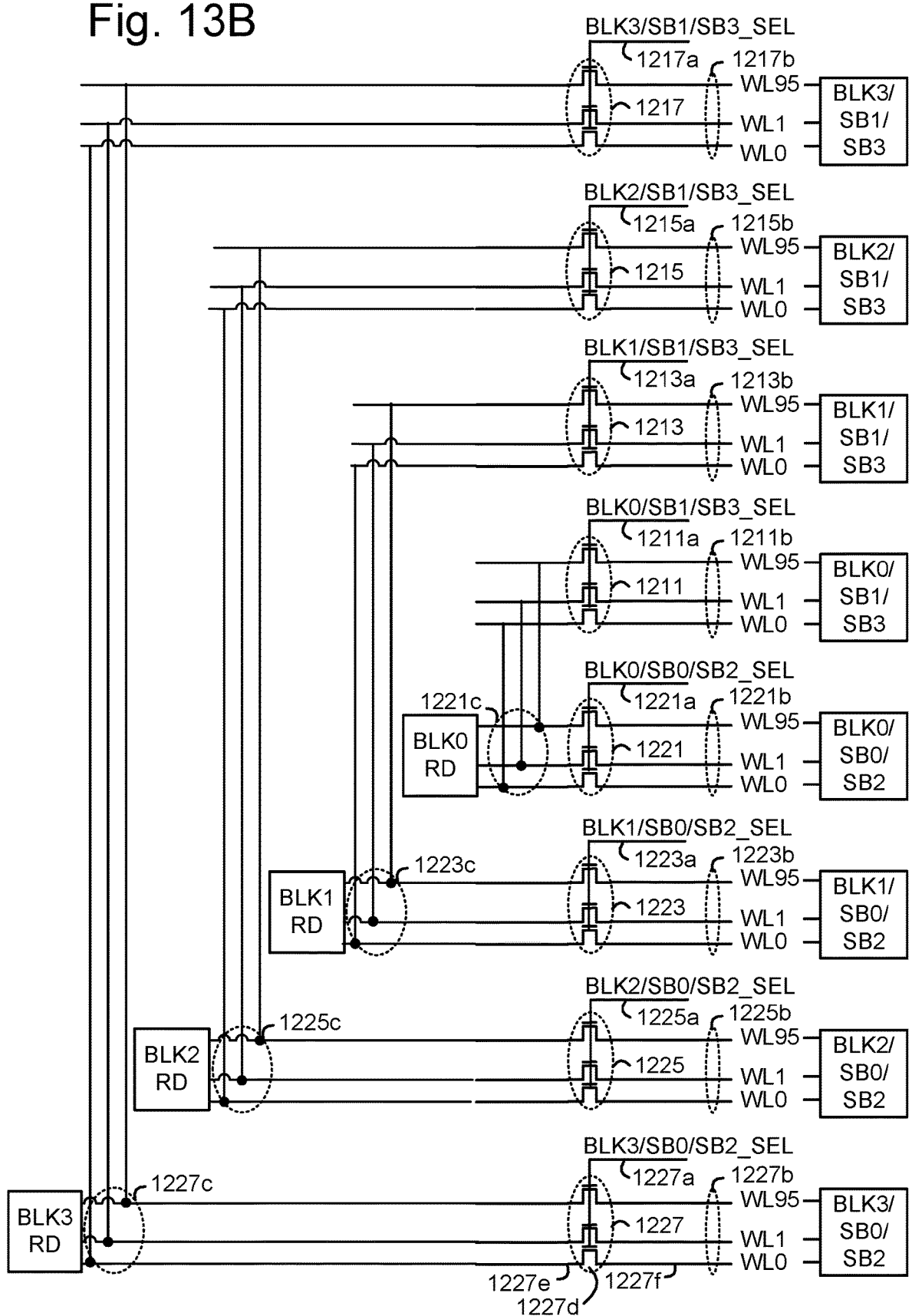
FIG. 13B depicts an example arrangement of the row decoders, word line switching transistors and sub-blocks of FIG. 13A.

FIG. 13B depicts an example arrangement of the row decoders, word line switching transistors and sub-blocks of FIG. 13A. The configuration is similar to that of FIG. 12B except that four sub-blocks are associated with each set of transistors. The sub-blocks are denoted by BLK0/SB0/SB2-BLK3/SB0/SB2 and BLK0/SB1/SB3-BLK3/SB1/SB3 and the row decoders are denoted by BLK0 RD-BLK3 RD. The sets of word line switching transistors 1221, 1223, 1225 and 1227 are associated with BLK0/SB0/SB2, BLK1/SB0/SB2, BLK2/SB0/SB2 and BLK3/SB0/SB2, respectively. The sets of word line switching transistors 1211, 1213, 1215 and 1217 are associated with BLK0/SB1/SB3, BLK1/SB1/SB3, BLK2/SB1/SB3 and BLK3/SB1/SB3, respectively.

The control signals BLK0/SB0/SB2_SEL, BLK1/SB0/SB2_SEL, BLK2/SB0/SB2_SEL and BLK3/SB0/SB2_SEL on paths 1221a, 1223a, 1225a and 1227a are used to control the sets of word line switching transistors 1221, 1223, 1225 and 1227, respectively. Similarly, the control signals BLK0/SB1/SB3_SEL, BLK1/SB1/SB3_SEL, BLK2/SB1/SB3_SEL and BLK3/SB1/SB3_SEL on paths 1211a, 1213a, 1215a and 1217a are used to control the sets of word line switching transistors 1211, 1213, 1215 and 1217, respectively.

Each row decoder provides a common word line voltage signal to each pair of vertically arranged sub-blocks of the respective block. For example, BLK0 RD provides a common word line voltage signal via conductive paths 1221c to the sets of word line switching transistors 1211 and 1221. The same word line voltage signal is thus provided to SB0/SB2 and SB1/SB3 of BLK0. BLK1 RD provides a common word line voltage signal via conductive paths 1223c to the sets of word line switching transistors 1213 and 1223. BLK2 RD provides a common word line voltage signal via conductive paths 1225c to the sets of word line switching transistors 1215 and 1225. BLK3 RD provides a common word line voltage signal via conductive paths 1227c to the sets of word line switching transistors 1217 and 1227.

FIG. 13C depicts an example arrangement of the sub-blocks BLK3/SB1 and BLK3/SB3 of FIG. 13A, including a staircase of word line layers and connections to one set of word line switching transistors. As in FIG. 12C, the sub-block includes five SGD groups of NAND strings, consistent with FIG. 7, as an example. A cross-sectional view of the sub-block along the line 1340 is provided in FIG. 13D.

The staircase 1316 is depicted at the left side of the sub-block and includes eight word line layers in a simplified example. Moreover, the lower region 1316a and the upper region 1316b of the staircase each includes four word line layers. Conductive paths 1316ai electrically connect each word line in the lower region to a respective word line switching transistor. Conductive paths 1316bi electrically connect each word line in the upper region to a respective word line switching transistor. As before, the set of word line switching transistors 1217 includes individual transistors 1217a-1217h which are each connected to a respective word line. The control signal BLK3/SB1/SB3_SEL is also depicted.

The sets of word line switching transistors can be on the same die as the blocks of memory cells or on a separate die.

FIG. 13D depicts a cross-sectional view of the sub-blocks of FIG. 13C along the line 1340. The alternating conductive and dielectric layers of the stack are depicted. The word line layers are shown by shaded rectangles while the dielectric layers are shown by unshaded rectangles. For simplicity, just eight word line layers are depicted. The layers form the staircase 1316, including the lower region 1316a and the upper region 1316b, separated by the interface IF of FIG. 6B. The word lines in the lower region are part of the sub-block BLK3/SB1 and the word lines in the upper region are part of the sub-block BLK3/SB3. Each word line is exposed to allow electrical connections to the set of word line switching transistors 1217 to be formed. An example NAND string 1332 is connected to a bit line in the set of bit lines 1231 by a via 1333.

Figure 14:
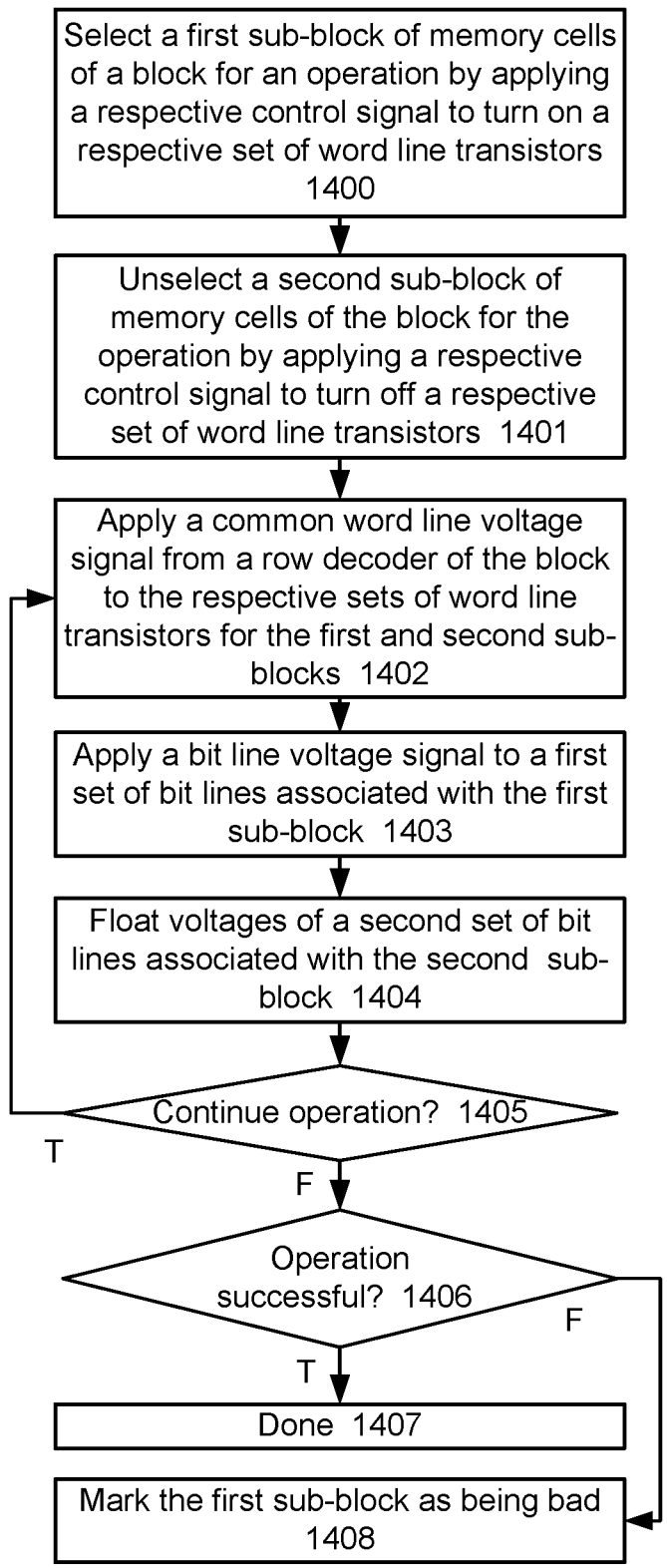
FIG. 14 depicts a flowchart of an example process for performing an operation on a selected sub-block of a block of memory cells.

FIG. 14 depicts a flowchart of an example process for performing an operation on a selected sub-block of a block of memory cells. Generally, an operation such as program, read or erase can be performed for one or more sub-blocks at a given time, when each sub-block has a respective set of word line switching transistors. Step 1400 includes selecting a first sub-block of memory cells of a block for an operation by applying a respective control signal to turn on a respective set of word line transistors. Step 1401 includes unselecting a second sub-block of memory cells of the block for the operation by applying a respective control signal to turn off a respective set of word line transistors. Step 1401 can be generalized to selecting one or more remaining sub-blocks of the block. Step 1402 includes applying a common word line voltage signal from a row decoder of the block to the respective sets of word line transistors for the first and second sub-blocks or, generally, to each sub-block of the block.

In one approach, for a selected block of the plurality of blocks, a respective row decoder is configured to provide a common word line voltage signal to the respective sets of word line switching transistors of the first and second sub-blocks of memory cells while setting the respective set of word line switching transistors of the first sub-block of memory cells to a conductive state and setting the respective set of word line switching transistors of the second sub-block of memory cells to a non-conductive state.

Step 1403 includes applying a bit line voltage signal to a first set of bit lines associated with the first sub-block, while step 1404 includes floating voltages of a second set of bit lines associated with the second sub-block. The ability to float the voltages saves power since only the first set of bit lines is driven in this example. In another option, the voltage of the second set of bit lines is driven at a different level than the first set of bit lines. In another option, the operation is performed on both the first and second sub-blocks, in which case both the first and second sets of bit lines are driven to perform the operation. For example, word lines of the two sub-blocks are be programmed concurrently with a program voltage, while the bit lines are set to allow or inhibit programming based on assigned data states of the memory cells.

A decision step 1405 determines whether to continue the operation. For example, in a program operation, another program pulse can be applied as the word line voltage signal. In an erase operation, another erase pulse can be applied while the memory cells are biased for erased by the word line voltage signal. In a read operation, another read voltage can be applied as the word line voltage signal. If the decision step 1405 is true (T), step 1402 is repeated. If the decision step 1405 is false (F), a decision step 1406 determines whether the operation is successful. If the decision step 1406 is true, the process is done at step 1407. If the decision step 1406 is false, step 1408 marks the first sub-block of memory cells of the block as being bad. This can be done by a control circuit which stores data identifying bad sub-blocks.

By providing a finer grained control of a block, a defective sub-block can be isolated while remaining sub-blocks of the block continue to be used.

Generally, various modes can be defined for a block. For example, consider a block with first and second sub-blocks, such as BLK0/SB0 and BLK0/SB1 in FIG. 10A. BLK0/SB0 and BLK0/SB1 can both be selected for an operation in one mode, BLK0/SB0 can be selected for an operation while BLK0/SB1 is unselected in another mode and BLK0/SB1 can be selected for an operation while BLK0/SB0 is unselected in yet another mode. As discussed, a sub-block can be selected by providing its respective set of word line switching transistors in a conductive state and a sub-block can be unselected by providing its respective set of word line switching transistors in a non-conductive state.

As another example, consider a block with first, second, third and fourth sub-blocks, where the third sub-block is atop the first sub-block and the fourth sub-block is atop the second sub-blocks. For instance, FIG. 11A depicts BLK0/SB2 atop BLK0/SB0, and BLK0/SB3 atop BLK0/SB1. The following modes can be defined in BLK0: 1) select one sub-block and unselect the three remaining sub-blocks, and 2) select any two sub-blocks and unselect the remaining two sub-blocks. Generally, for a block with four sub-blocks, separate operations such as read or program cannot be performed concurrently on the two sub-blocks. For example, BLK0/SB2 and BLK0/SB0 cannot be programmed or read at the same time. However, 1) BLK0/SB0 and 2) BLK0/SB1 or SB3 can be operated simultaneously, for instance. Moreover, all four sub-blocks can be erased together if needed in a block erase.

An example method includes selecting a first sub-block of a block of memory cells while unselecting a second sub-block of the block of memory cells, where the selecting of the first sub-block comprises applying a respective control signal to a respective set of word line switching transistors of the first sub-block to provide the respective set of word line switching transistors of the first sub-block in a conductive state, and the unselecting of the second sub-block comprises applying a respective control signal to a respective set of word line switching transistors of the second sub-block to provide the respective set of word line switching transistors of the second sub-block in a non-conductive state. Additionally, the method further includes, while the first sub-block is selected and the second sub-block is unselected, applying a common word line voltage signal to the respective set of word line switching transistors of the first sub-block and to the respective set of word line switching transistors of the second sub-block in connection with an operation on the first sub-block.

Further, when the block comprises a third sub-block atop the first sub-block and a fourth sub-block atop the second sub-block, the method further comprises during the selecting of the first sub-block and the unselecting of the second sub-block, unselecting the third and fourth sub-blocks.

A further example includes setting a first mode in which the first sub-block is selected for an operation while the second sub-block is unselected for an operation, wherein in the first mode, the respective set of word line switching transistors of the first sub-block is provided in a conductive state while the respective set of word line switching transistors of the second sub-block is provided in a non-conductive state and a common word line voltage signal is provided to the respective sets of word line switching transistors of the first and second sub-blocks; and setting a second mode in which the first and second sub-blocks are selected for an operation, wherein in the second mode, the respective sets of word line switching transistors of the first and second sub-blocks are provided in the non-conductive state and a common word line voltage signal is provided to the respective sets of word line switching transistors of the first and second sub-blocks.

The technique can further include, in the first mode, while applying the common word line voltage signal, apply a first bit line voltage signal to a first set of bit lines associated with the first sub-block and float voltages of a second set of bit lines associated with the second sub-block.

The block may comprise a third sub-block atop the first sub-block and a fourth sub-block atop the second sub-block, where a respective set of word line switching transistors is associated with the third sub-block, and a respective set of word line switching transistors is associated with the fourth sub-block. The technique can further include setting a mode in which the third sub-block is selected for an operation while the first, second and fourth sub-blocks are unselected for an operation.

The technique can further include setting a mode in which the third and fourth sub-blocks are selected for an operation while the first and second sub-blocks are unselected for an operation.

The technique can further include setting a mode in which the first and fourth sub-blocks are selected for an operation while the second and third sub-blocks are unselected for an operation.

Accordingly, it can be seen that in one implementation, an apparatus comprises: a plurality of blocks of memory cells arranged on substrate, each block comprising a first sub-block and a second sub-block, the first sub-blocks are arranged laterally one after another on a first side of a dividing line, and the second sub-blocks are arranged laterally one after another on a second side of the dividing line, opposite the first side; a respective set of word line switching transistors for each first sub-block and for each second sub-block; and a plurality of respective row decoders, one respective row decoder for each block, wherein for each block, the respective row decoder is configured to provide a common word line voltage signal to the respective sets of word line switching transistors of the first and second sub-blocks, and the respective set of word line switching transistors for the first sub-block is configured to switch independently from the respective set of word line switching transistors for the second sub-block.

In another implementation, a method comprises: selecting a first sub-block of a block of memory cells while unselecting a second sub-block of the block of memory cells, the first and second sub-blocks are separated from one another on a substrate; the selecting the first sub-block comprises applying a respective control signal to a respective set of word line switching transistors of the first sub-block to provide the respective set of word line switching transistors of the first sub-block in a conductive state, and the unselecting of the second sub-block comprises applying a respective control signal to a respective set of word line switching transistors of the second sub-block to provide the respective set of word line switching transistors of the second sub-block in a non-conductive state; and while the first sub-block is selected and the second sub-block is unselected, applying a common word line voltage signal to the respective sets of word line switching transistors of the first and second sub-blocks in connection with an operation on the first sub-block.

In another implementation, an apparatus comprises: a control circuit configured to connect to a block of memory cells, the block of memory cells is arranged in a plane on a substrate and comprises a first sub-block and a second sub-block, a respective set of word line switching transistors is associated with the first sub-block and a respective set of word line switching transistors is associated with the second sub-block; and a memory interface connected to the control circuit. The control circuit is configured to issue commands via the memory interface to: set a first mode in which the first sub-block is selected for an operation while the second sub-block is unselected for an operation, wherein in the first mode, the respective set of word line switching transistors of the first sub-block is provided in a conductive state while the respective set of word line switching transistors of the second sub-block is provided in a non-conductive state and a common word line voltage signal is provided to the respective sets of word line switching transistors of the first and second sub-blocks; and set a second mode in which the first and second sub-blocks are selected for an operation, wherein in the second mode, the respective sets of word line switching transistors of the first and second sub-blocks are provided in the non-conductive state and a common word line voltage signal is provided to the respective sets of word line switching transistors of the first and second sub-blocks.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of blocks of memory cells arranged on substrate, each block comprising a first sub-block and a second sub-block, the first sub-blocks are arranged laterally one after another on a first side of a dividing line, and the second sub-blocks are arranged laterally one after another on a second side of the dividing line, opposite the first side;
a respective set of word line switching transistors for each first sub-block and for each second sub-block; and
a plurality of respective row decoders, one respective row decoder for each block, wherein for each block, the respective row decoder is configured to provide a common word line voltage signal to the respective sets of word line switching transistors of the first and second sub-blocks, and the respective set of word line switching transistors for the first sub-block is configured to switch independently from the respective set of word line switching transistors for the second sub-block.

2. The apparatus of claim 1, further comprising:
a first set of bit lines extending on the first side to the first sub-blocks; and
a second set of bit lines extending on the second side to the second sub-blocks.

3. The apparatus of claim 1, wherein:
each first sub-block comprises a stack of alternating word line layers and dielectric layers and a staircase at a side of the stack; and
the side of the stack at which the staircase is formed alternates between one side and another, opposing side for consecutive first sub-blocks of the plurality of blocks.

4. The apparatus of claim 3, wherein:
each staircase has a width from one side of the staircase to another, opposing side of the staircase; and
for each first sub-block, the respective set of word line switching transistors is in a region having a width greater than the width of the staircase.

5. The apparatus of claim 1, wherein:
each first sub-block comprises memory cells arranged in a plurality of select gate groups.

6. The apparatus of claim 1, wherein:
the plurality of blocks of memory cells are arranged on a first die; and
the sets of word line switching transistors are arranged on a second die connected to the first die at bond pads of the first and second die.

7. The apparatus of claim 1, wherein:
each respective set of word line switching transistors comprise word line switching transistors having control gates connected to one another.

8. The apparatus of claim 1, wherein:
for a selected block of the plurality of blocks, the respective row decoder is configured to provide the common word line voltage signal to the respective sets of word line switching transistors of the first and second sub-blocks while setting the respective set of word line switching transistors of the first sub-block to a conductive state and setting the respective set of word line switching transistors of the second sub-block to a non-conductive state.

9. The apparatus of claim 1, wherein:
each block comprises a third sub-block atop the first sub-block and a fourth sub-block atop the second sub-block; the respective sets of word line switching transistors for the first sub-blocks are shared with the third sub-blocks; and
the respective sets of word line switching transistors for the second sub-blocks are shared with the fourth sub-blocks.

10. The apparatus of claim 9, wherein:
for each block, the first sub-block comprises a lower tier of a stack of alternating word line layers and dielectric layers and the third sub-block comprises an upper tier of the stack of alternating word line layers and dielectric layers.

11. The apparatus of claim 9, wherein:
for a selected block of the plurality of blocks, the respective row decoder is configured to provide the common word line voltage signal to the respective set of word line switching transistors of the first, second, third and fourth sub-blocks.

12. A method, comprising:
selecting a first sub-block of a block of memory cells while unselecting a second sub-block of the block of memory cells, the first and second sub-blocks are separated from one another on a substrate;
the selecting the first sub-block comprises applying a respective control signal to a respective set of word line switching transistors of the first sub-block to provide the respective set of word line switching transistors of the first sub-block in a conductive state, and the unselecting of the second sub-block comprises applying a respective control signal to a respective set of word line switching transistors of the second sub-block to provide the respective set of word line switching transistors of the second sub-block in a non-conductive state; and
while the first sub-block is selected and the second sub-block is unselected, applying a common word line voltage signal to the respective sets of word line switching transistors of the first and second sub-blocks in connection with an operation on the first sub-block.

13. The method of claim 12, further comprising:
while applying the common word line voltage signal, applying a first bit line voltage signal to a first set of bit lines of the first sub-block and floating voltages of a second set of bit lines of the second sub-block.

14. The method of claim 12, further comprising:
in connection with the operation, determining that the first sub-block comprises a defect; and
in response to the determining that the first sub-block comprises the defect, marking the first sub-block as being bad while the second sub-block remains available for an operation.

15. The method of claim 12, wherein the block comprises a third sub-block atop the first sub-block and a fourth sub-block atop the second sub-block, the method further comprising:
during the selecting of the first sub-block and the unselecting of the second sub-block, unselecting the third and fourth sub-blocks.

16. An apparatus, comprising:
a control circuit configured to connect to a block of memory cells, the block of memory cells is arranged in a plane on a substrate and comprises a first sub-block and a second sub-block, a respective set of word line switching transistors is associated with the first sub-block and a respective set of word line switching transistors is associated with the second sub-block; and a memory interface connected to the control circuit, the control circuit is configured to issue commands via the memory interface to:

set a first mode in which the first sub-block is selected for an operation while the second sub-block is unselected for an operation, wherein in the first mode, the respective set of word line switching transistors of the first sub-block is provided in a conductive state while the respective set of word line switching transistors of the second sub-block is provided in a non-conductive state and a common word line voltage signal is provided to the respective sets of word line switching transistors of the first and second sub-blocks; and set a second mode in which the first and second sub-blocks are selected for an operation, wherein in the second mode, the respective sets of word line switching transistors of the first and second sub-blocks are provided in the non-conductive state and a common word line voltage signal is provided to the respective sets of word line switching transistors of the first and second sub-blocks.

17. The apparatus of claim 16, wherein the control circuit is configured to issue commands via the memory interface to:

in the first mode, while applying the common word line voltage signal, apply a first bit line voltage signal to a first set of bit lines associated with the first sub-block and float voltages of a second set of bit lines associated with the second sub-block.

18. The apparatus of claim 16, wherein:

the block comprises a third sub-block atop the first sub-block and a fourth sub-block atop the second sub-block;

the respective set of word line switching transistors of the first sub-block is shared with the third sub-block;

the respective set of word line switching transistors of the second sub-block is shared with the fourth sub-block; and the control circuit is configured to issue a command via the memory interface to set a mode in which the third sub-block is selected for an operation while the first, second and fourth sub-blocks are unselected for an operation.

19. The apparatus of claim 16, wherein:

the block comprises a third sub-block atop the first sub-block and a fourth sub-block atop the second sub-block;

the respective set of word line switching transistors for the first sub-block is shared with the third sub-block;

the respective set of word line switching transistors for the second sub-block is shared with the fourth sub-block; and the control circuit is configured to issue a command via the memory interface to set a mode in which the third and fourth sub-blocks are selected for an operation while the first and second sub-blocks are unselected for an operation.

20. The apparatus of claim 16, wherein:

the block comprises a third sub-block atop the first sub-block and a fourth sub-block atop the second sub-block;

the respective set of word line switching transistors for the first sub-block is shared with the third sub-block;

the respective set of word line switching transistors for the second sub-block is shared with the fourth sub-block; and the control circuit is configured to issue a command via the memory interface to set a mode in which the first and fourth sub-blocks are selected for an operation while the second and third sub-blocks are unselected for an operation.

* * * * *